United States Patent
Ootsuka et al.

(10) Patent No.: US 8,527,727 B2
(45) Date of Patent: Sep. 3, 2013

(54) SEMICONDUCTOR STORAGE DEVICE, WITH ORGANIZING-STATE NOTIFY PROCESSING

(75) Inventors: Naoki Ootsuka, Kanagawa (JP); Hirokazu Morita, Kanagawa (JP); Hirokuni Yano, Tokyo (JP)

(73) Assignee: Kabushiiki Kaisha Toshiba, Tokyo (JP)

( * ) Notice: Subject to any disclaimer, the term of this patent is extended or adjusted under 35 U.S.C. 154(b) by 266 days.

(21) Appl. No.: 13/052,146

(22) Filed: Mar. 21, 2011

(65) Prior Publication Data

US 2011/0314204 A1  Dec. 22, 2011

(30) Foreign Application Priority Data

Jun. 22, 2010  (JP) .................................. 2010-141774

(51) Int. Cl.
*G06F 12/04* (2006.01)

(52) U.S. Cl.
USPC .... 711/165; 711/103; 711/122; 711/E12.008; 711/E12.009

(58) Field of Classification Search
USPC ........... 711/103, 122, 165, E12.008, E12.009
See application file for complete search history.

(56) References Cited

U.S. PATENT DOCUMENTS

| 6,779,045 | B2* | 8/2004 | Kendall et al. ..................... 710/5 |
| 2008/0010395 | A1* | 1/2008 | Mylly et al. ................... 711/100 |
| 2009/0248964 | A1* | 10/2009 | Yano et al. .................... 711/103 |
| 2009/0292862 | A1* | 11/2009 | Kitahara ....................... 711/103 |
| 2010/0037009 | A1 | 2/2010 | Yano et al. |
| 2010/0037010 | A1 | 2/2010 | Yano et al. |
| 2010/0037011 | A1 | 2/2010 | Yano et al. |
| 2010/0037012 | A1 | 2/2010 | Yano et al. |
| 2010/0049907 | A1 | 2/2010 | Kitsunai et al. |
| 2010/0077266 | A1 | 3/2010 | Kanno et al. |
| 2010/0146228 | A1 | 6/2010 | Kanno et al. |
| 2010/0161885 | A1 | 6/2010 | Kanno et al. |
| 2010/0169549 | A1 | 7/2010 | Yano et al. |
| 2010/0169551 | A1 | 7/2010 | Yano et al. |
| 2010/0169553 | A1 | 7/2010 | Yano et al. |
| 2010/0223424 | A1 | 9/2010 | Kitsunai et al. |
| 2010/0313084 | A1 | 12/2010 | Hida et al. |

FOREIGN PATENT DOCUMENTS

| JP | 2009-211231 A | 9/2009 |
| WO | WO 2011/074712 A1 | 6/2011 |

OTHER PUBLICATIONS

U.S. Appl. No. 13/609,991, filed Sep. 11, 2012, Hirao, et al.
U.S. Appl. No. 13/326,872, filed Dec. 15, 2011, Hirao, et al.
U.S. Appl. No. 13/328,496, filed Dec. 16, 2011, Hida, et al.
U.S. Appl. No. 13/328,471, filed Dec. 16, 2011, Yano, et al.
U.S. Appl. No. 12/884,844, filed Sep. 17, 2010, Hirokuni Yano, et al.

(Continued)

*Primary Examiner* — Hal Schnee
(74) *Attorney, Agent, or Firm* — Oblon, Spivak, McClelland, Maier & Neustadt, L.L.P.

(57) ABSTRACT

According to the embodiments, a first storing unit as a cache, second and third storing units included in a nonvolatile semiconductor memories, and a controller are included, in which the controller includes an organizing unit that increases a resource by organizing data in the nonvolatile semiconductor memories, and an organizing-state notifying unit that, when an organizing-state notification request is input from a host, outputs an organizing state by the organizing unit to the host as an organizing-state notification, thereby improving a command response speed and the writing efficiency.

21 Claims, 19 Drawing Sheets

(56) References Cited

OTHER PUBLICATIONS

U.S. Appl. No. 13/063,210, filed Mar. 10, 2011, Hirokuni Yano, et al.
U.S. Appl. No. 13/063,255, filed Mar. 10, 2011, Hirokuni Yano, et al.
U.S. Appl. No. 13/599,087, filed Aug. 30, 2012, Yonezawa, et al.
U.S. Appl. No. 13/238,675, filed Sep. 21, 2011, Norimatsu, et al.

* cited by examiner

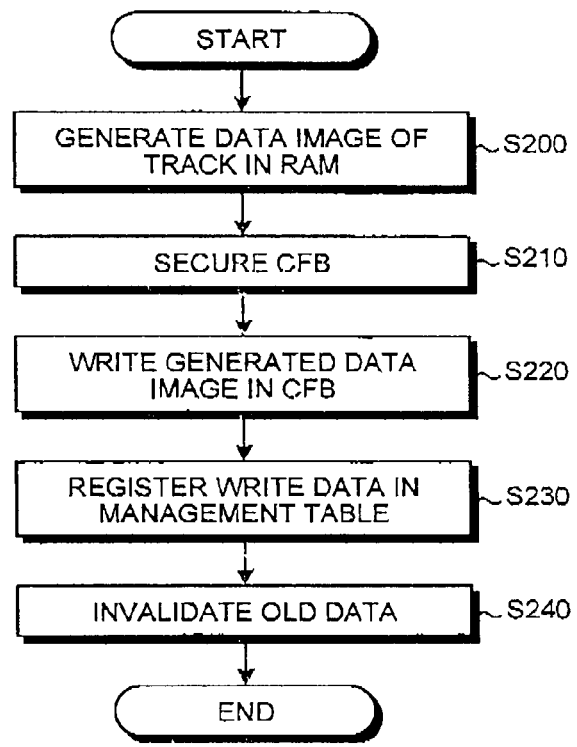
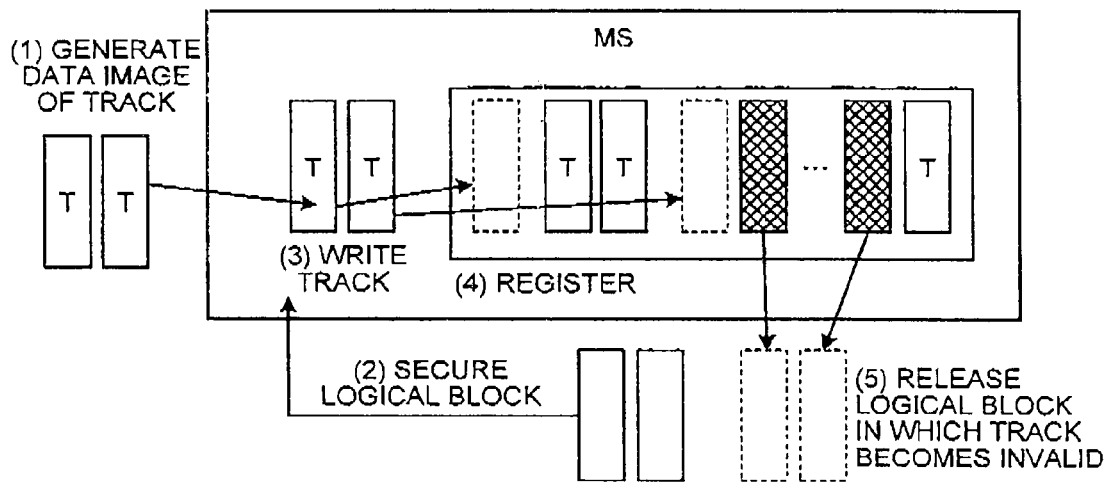

FIG.15

| RESOURCE NAME | MAXIMUM VALUE | UPPER LIMIT | TARGET VALUE | ACTION |
|---|---|---|---|---|
| NUMBER OF FS BLOCKS | Xmax | Xlmt | Xtgt | FS→IS |
| NUMBER OF IS BLOCKS | Ymax | Ylmt | Ytgt | IS COMPACTION (DEFRAGMENTATION) |
| CLUSTER DIRECTORY | Zmax | Zlmt | Ztgt | DEFRAGMENTATION |
| CLUSTER TABLE | Wmax | Wlmt | Wtgt | DEFRAGMENTATION |

FIG.16

Register Host to Device (RegHD)

| | value | COMMAND |
|---|---|---|
| Feature | 01h | ORGANIZING EXECUTION REQUEST |
| | 02h | ORGANIZING-STATE NOTIFICATION REQUEST |
| | 03h | ORGANIZING STOP REQUEST |
| Command | | XXh |
| Count | | N/A |
| LBA | | IN CASE OF Feature 01h<br>01h  short<br>02h  long |
| Device | | |
| ⋮ | | ⋮ |

FIG.17

Register Device to Host (RegHD)

| Feature | value | status | |
|---|---|---|---|
| | 00h | NON-EXECUTING STATE | |
| | 01h | INTERRUPTED STATE | |
| | 02h | EXECUTING STATE | |
| Command | XXh | | |
| Count | value | RESOURCE | THRESHOLD |
| | 00h | FS | UPPER LIMIT |
| | 01h | FS | TARGET VALUE |
| | 10h | IS | UPPER LIMIT |
| | 11h | IS | TARGET VALUE |
| LBA | PROGRESS (0 TO 100%) | | |
| Device | | | |
| ⋮ | ⋮ | | |

SEMICONDUCTOR STORAGE DEVICE, WITH ORGANIZING-STATE NOTIFY PROCESSING

CROSS-REFERENCE TO RELATED APPLICATIONS

This application is based upon and claims the benefit of priority from the prior Japanese Patent Application No. 2010-141774, filed on Jun. 22, 2010; the entire contents of which are incorporated herein by reference.

FIELD

Embodiments described herein relate generally to a semiconductor storage device that includes a nonvolatile semiconductor memory, a control method thereof, and an information processing apparatus.

BACKGROUND

As an external storage device of a host apparatus, an SSD (Solid State Drive) on which a nonvolatile semiconductor memory such as a NAND-type flash memory is mounted attracts attention. The NAND-type flash memory has advantages such as high speed and lightweight compared with a magnetic disk device.

BRIEF DESCRIPTION OF THE DRAWINGS

FIG. 8 is a flowchart illustrating an operation procedure of the write processing from the WC to an MS;

FIG. 9 is a schematic diagram illustrating an operation concept of the write processing from the WC to the MS;

FIG. 15 is a diagram illustrating a relationship between NAND-organizing target resources, thresholds, and the like;

FIG. 16 is a diagram illustrating an FIS of Register Host to Device;

FIG. 17 is a diagram illustrating an FIS of Register Device to Host;

DETAILED DESCRIPTION

Figure 1:
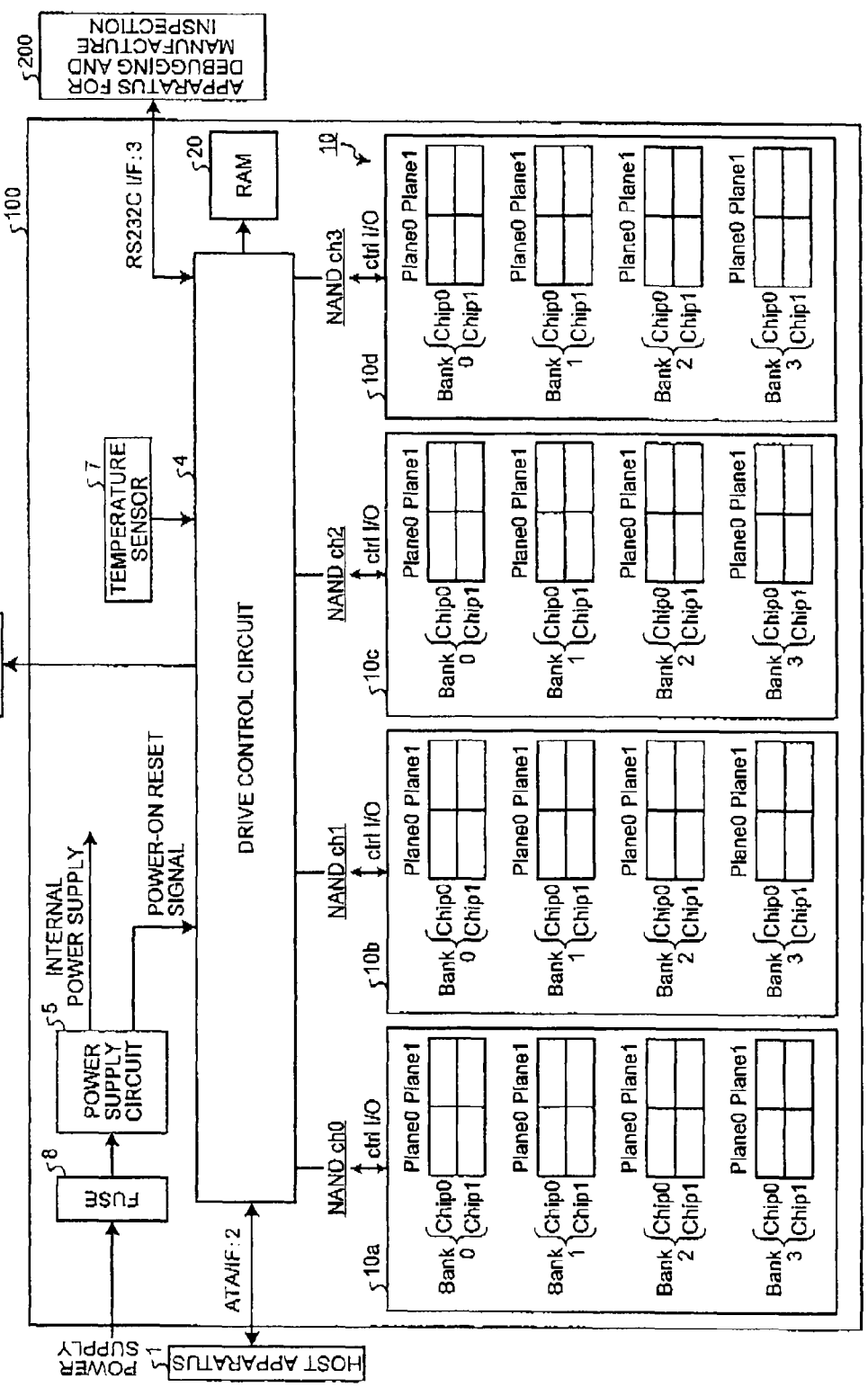
FIG. 1 is a block diagram illustrating a configuration example of an SSD.

According to embodiments, a semiconductor storage device includes a first storing unit as a cache memory, a second storing unit and a third storing unit included in a nonvolatile semiconductor memories in which data reading and data writing is performed by a page unit and data erasing is performed by a block unit larger than the page unit, and a controller that allocates a storage areas of the nonvolatile semiconductor memories to the second storing unit and the third storing unit by a logical block unit associated with one or more blocks.

The controller includes a write control unit, a flush control unit, an organizing unit, and an organizing-state notifying unit. The write control unit writes a plurality of data in a sector unit into the first storing unit. The flush control unit flushes a plurality of data written in the first storing unit to the second storing unit as data in a first management unit twice or larger natural number times as large as the sector unit and flushes a plurality of data written in the first storing unit to the third storing unit as data in a second management unit twice or larger natural number times as large as the first management unit. The organizing unit increases a resource by organizing data in the nonvolatile semiconductor memories when a resource usage of the nonvolatile semiconductor memories exceeds a predetermined threshold. The organizing-state notifying unit analyzes an organizing state by the organizing unit and outputs an analysis result to a host as an organizing-state notification when an organizing-state notification request is input from the host.

An SSD is often configured to reduce the number of times of writing (number of times of erasing) in a flash memory by interposing a cache memory between the flash memory and a host apparatus. In a case of writing from the host apparatus to the cache memory, if the cache memory is full, data is flushed from the cache memory to the flash memory and then data is written in the cache memory.

In the SSD, when a data erasing unit (block) and a data management unit are different, according to the progress of rewriting of the flash memory, blocks are made porous by invalid (non-latest) data. When the blocks in such a porous state increase, substantially usable blocks decrease and a storage area of the flash memory cannot be effectively used. Therefore, the flash memory needs to be organized by performing, for example, compaction of collecting valid latest date and rewriting the data in a different block.

While organizing the flash memory, when sequential write requests are made from the host, if the write requests are prioritized, the organizing is kept interrupted. If the cache memory becomes full while the organizing is interrupted, free blocks of the flash memory become insufficient, so that data flushing from the cache memory to the flash memory becomes difficult, leading to reduction of a command response speed and writing efficiency.

Embodiments of the present invention are explained below with reference to the drawings. In the following explanation, components having the same functions and configurations are denoted by the same reference numerals and signs. Redundant explanation is performed only when necessary.

First, terms used in the specification are defined.

Physical page: A unit that can be collectively written and read out in a NAND-type flash memory.

Logical page: A writing and readout unit set in an SSD. A logical page is associated with one or more physical pages.

Physical block: A minimum unit that can be independently erased in a NAND-type flash memory. A physical block includes a plurality of physical pages.

Logical block: An erasing unit set in an SSD. A logical block is associated with one or more physical blocks. A logical block includes a plurality of logical pages.

Sector: A minimum access unit from a host. A sector size is, for example, 512 bytes (B).

Cluster: A management unit for managing "small data" in an SSD. A cluster size is equal to or larger than the sector size and is set to be equal to a data management unit of a file system that an operating system (OS) of a host employs or a logical page size. For example, the cluster size can be set such that a size twice or larger natural number times as large as the cluster size is the logical page size.

Track: A management unit for managing "large data" in an SSD. A track size is set such that a size twice or larger natural number times as large as the cluster size is the track size. For example, the track size can be set equal to the logical block size.

Free block (FB): A logical block which does not include valid data therein and to which a use is not allocated. A free block includes the following two types, i.e., a complete free block (CFB) and a fragment free block (FFB).

Complete free block (CFB): An FB on which an erasing operation needs to be performed for reuse. After performing the erasing operation, writing can be performed from a logical page positioned at the top of a logical block.

Fragment free block (FFB): An FB in which a logical page with no data written therein remains and which can be reused without performing the erasing operation. Writing can be performed in the remaining logical page with no data written therein.

Writing efficiency: A statistical value of an erasing amount of the logical block with respect to an amount of data written from the host in a specific period. As the writing efficiency is smaller, a wear degree of a NAND-type flash memory is smaller.

Valid cluster: Latest data with a cluster size corresponding to a logical address.

Invalid cluster: Data with a cluster size that is not to be referred as a result that data having an identical logical address is written in a different location.

Valid track: Latest data with a track size corresponding to a logical address.

Invalid track: Data with a track size that is not to be referred as a result that data having an identical logical address is written in a different location.

Multi level cell (MLC) mode: Mode in which writing is performed as normal using an upper page and a lower page in a NAND-type flash memory capable of multi-value recording.

A logical block of the MLC mode is configured by associating with one or more physical blocks used in the MLC mode.

Pseudo single level cell (SLC) mode: Mode in which writing is performed using only a lower page in a NAND-type flash memory capable of multi-value recording. A logical block of the pseudo SLC mode is configured by associating with one or more physical blocks used in the pseudo SLC mode. Even a physical block used once in the pseudo SLC mode can be used in the MLC mode after the erasing operation.

(First Embodiment)

FIG. 1 is a block diagram illustrating a configuration example of an SSD (Solid State Drive) 100. The SSD 100 is connected to a host apparatus (hereinafter, host) 1 such as a personal computer (PC) or a central processing unit (CPU) core via a memory connection interface such as an advanced technology attachment interface (ATA I/F) 2 and functions as an external memory of the host 1. Examples of the host 1 include a CPU of a PC and a CPU of an imaging device such as a still camera and a video camera. The SSD 100 can transmit and receive data to and from an apparatus for debugging and manufacture inspection 200 via a communication interface 3 such as an RS232C I/F. The SSD 100 includes a NAND-type flash memory (hereinafter, NAND memory) 10 as a nonvolatile semiconductor memory, a drive control circuit 4 as a controller, a random access memory (RAM) 20 as a semiconductor memory capable of performing a high-speed storing operation compared with the NAND memory 10, a power supply circuit 5, a light-emitting diode (LED) for state display 6, a temperature sensor 7 that detects a temperature in a drive, and a fuse 8. As the RAM 20, a dynamic random access memory (DRAM), a ferroelectric random access memory (FeRAM), a magnetoresistive random access memory (MRAM), a phase change random access memory (PRAM), or the like can be used.

The power supply circuit 5 generates a plurality of different internal direct current (DC) power supply voltages from an external DC power supplied from a power supply circuit on the host 1 side and supplies these internal DC power supply voltages to respective circuits in the SSD 100. The power supply circuit 5 detects a rising edge of an external power supply, generates a power-on reset signal, and supplies the power-on reset signal to the drive control circuit 4. The fuse 8 is provided between the power supply circuit on the host 1 side and the power supply circuit 5 in the SSD 100. When an overcurrent is supplied from an external power supply circuit, the fuse 8 is disconnected to prevent malfunction of the internal circuits.

The NAND memory 10 stores therein user data specified by the host 1 and management information managed in the RAM 20 for backup. The NAND memory 10 includes a memory cell array in which a plurality of memory cells is arrayed in a matrix manner, and each memory cell is capable of multi-value recording by using an upper page and a lower page. The NAND memory 10 includes a plurality of memory chips and each memory chip is configured by arraying a plurality of physical blocks as a unit of data erasing. In the NAND memory 10, writing and reading of data is performed in physical page units. A physical block consists of a plurality of physical pages.

In FIG. 1, the NAND memory 10 is connected to a NAND controller 113 in the drive control circuit 4 via four channels (4ch: ch0 to ch3) in parallel and therefore can operate four channel parallel operation elements 10a to 10d in parallel. The number of channels is not limited to four and any number can be arbitrary employed. Each of the parallel operation elements 10a to 10d includes a plurality of banks (in this case, four banks (Bank0 to Bank3)) capable of performing bank interleave. Each bank includes a plurality of memory chips (in this case, two memory chips (Chip0 and Chip1)). Each memory chip is divided into, for example, two districts of a plane 0 and a plane 1 each of which includes a plurality of physical blocks. The plane 0 and the plane 1 include peripheral circuits independent from each other (e.g., a row decoder, a column decoder, a page buffer, and a data cache) and can simultaneously perform erasing, writing, and reading by using a double speed mode. In this manner, each NAND memory chip of the NAND memory 10 can perform the parallel operation by a plurality of channels, the bank interleave operation by a plurality of banks, and the parallel operation by the double speed mode using a plurality of planes. Each memory chip can be divided into four planes or be configured without being divided.

The RAM 20 functions as a cache for data transfer between the host 1 and the NAND memory 10, a memory for a work area, and the like. In the memory for the work area of the RAM 20, a master table (snapshot) that is obtained by loading various management tables (to be described later) stored in the NAND memory 10 at the time of start-up or the like, log information that is a change difference of a management table, and the like are stored. The drive control circuit 4 performs data transfer control between the host 1 and the NAND memory 10 via the RAM 20 and controls the respective components in the SSD 100. The drive control circuit 4 supplies a signal for state display to the LED for state display 6. The drive control circuit 4 also has a function of receiving a power-on reset signal from the power supply circuit 5 and supplying a reset signal and a clock signal to respective units in the own circuit and the SSD 100.

Figure 2:
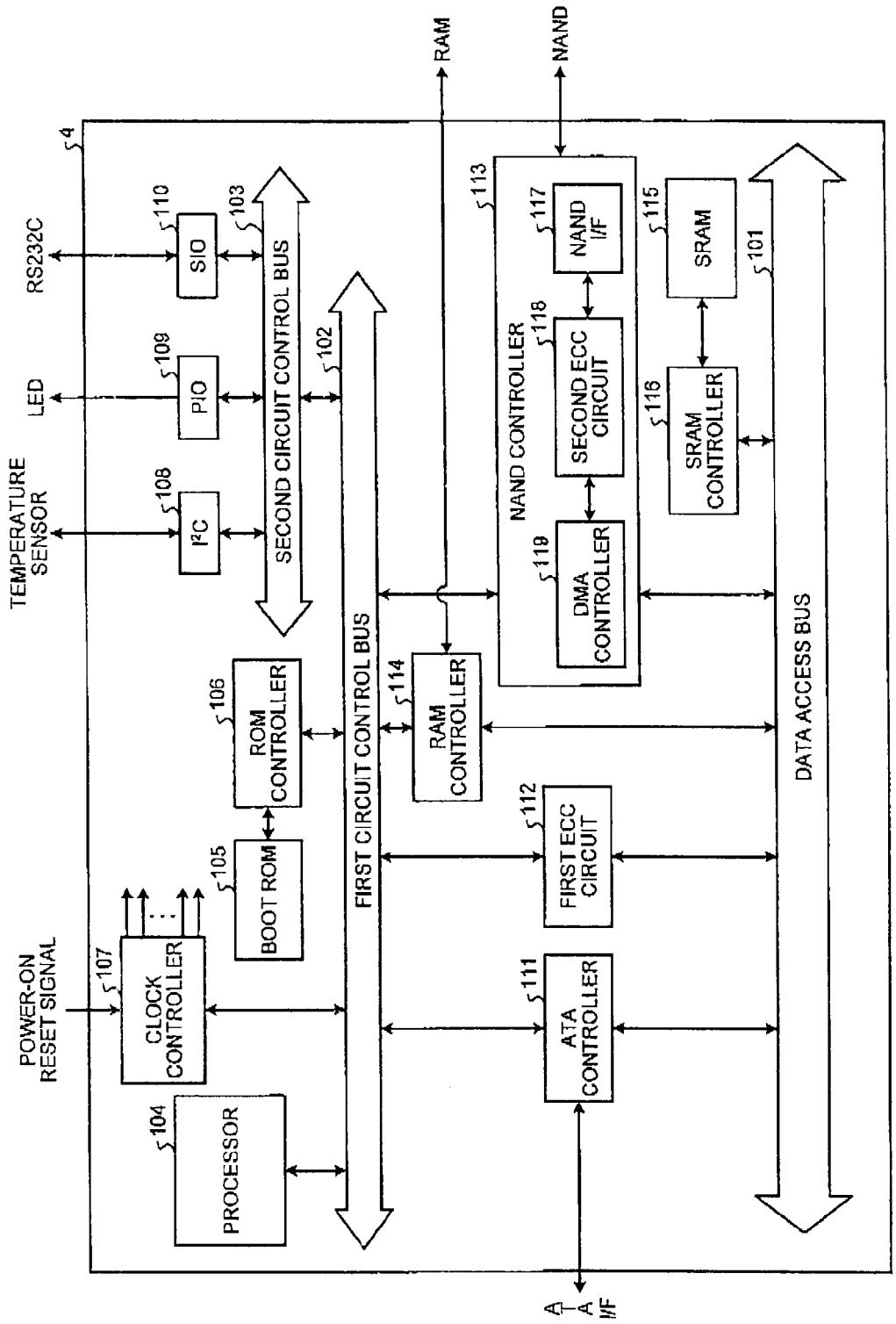
FIG. 2 is a block diagram illustrating a hardware internal configuration example of a drive control circuit.

FIG. 2 is a block diagram illustrating a hardware internal configuration example of the drive control circuit 4. The drive control circuit 4 includes a data access bus 101, a first circuit control bus 102, and a second circuit control bus 103. A processor 104 that controls the entire drive control circuit 4 is connected to the first circuit control bus 102. A boot ROM 105, in which a boot program for booting respective management programs (FW: firmware) stored in the NAND memory 10 is stored, is connected to the first circuit control bus 102 via, a ROM controller 106. A clock controller 107 that receives the power-on reset signal from the power supply circuit 5 shown in FIG. 1 and supplies a reset signal and a clock signal to the respective units is connected to the first circuit control bus 102.

The second circuit control bus 103 is connected to the first circuit control bus 102. An I²C circuit 108 for receiving data from the temperature sensor 7 shown in FIG. 1, a parallel IO (PIO) circuit 109 that supplies a signal for state display to the LED for state display 6, and a serial IO (SIO) circuit 110 that controls the RS232C I/F 3 are connected to the second circuit control bus 103.

An ATA interface controller (ATA controller) 111, a first error checking and correction (ECC) circuit 112, the NAND controller 113, and a RAM controller 114 are connected to both the data access bus 101 and the first circuit control bus 102. The ATA controller 111 transmits data to and receives data from the host 1 via the ATA interface 2. A static random access memory (SRAM) 115 used as a data work area and a firmware loading area is connected to the data access bus 101 via an SRAM controller 116. When the firmware stored in the NAND memory 10 is started, the firmware is transferred to the SRAM 115 by the boot program stored in the boot ROM 105.

The NAND controller 113 includes a NAND I/F 117 that performs interface processing for interface with the NAND memory 10, a second ECC circuit 118, and a direct memory access (DMA) controller for DMA transfer control 119 that performs access control between the NAND memory 10 and the RAM 20. The second ECC circuit 118 performs encoding of a second correction code and performs encoding and decoding of a first error correction code. The first ECC circuit 112 performs decoding of a second error correction code. The first error correction code and the second error correction code are, for example, a Hamming code, a Bose Chaudhuri Hocquenghem (BCH) code, a Reed Solomon (RS) code, or a low density parity check (LDPC) code. Correction ability of the second error correction code is higher than correction ability of the first error correction code.

As shown in FIG. 1, in the NAND memory 10, the four parallel operation elements 10a to 10d are connected in parallel to the NAND controller 113 in the drive control circuit 4 via four channels (4ch) each for a plurality of bits, so that the four parallel operation elements 10a to 10d can be actuated in parallel. The NAND memory 10 of each channel is divided into four banks capable of the bank interleave, and can access to the plane 0 and the plane 1 of each memory chip simultaneously. Therefore, processing such as writing can be performed almost simultaneously on eight physical blocks (4 banks×2 planes) at the maximum for each channel.

Figure 3:
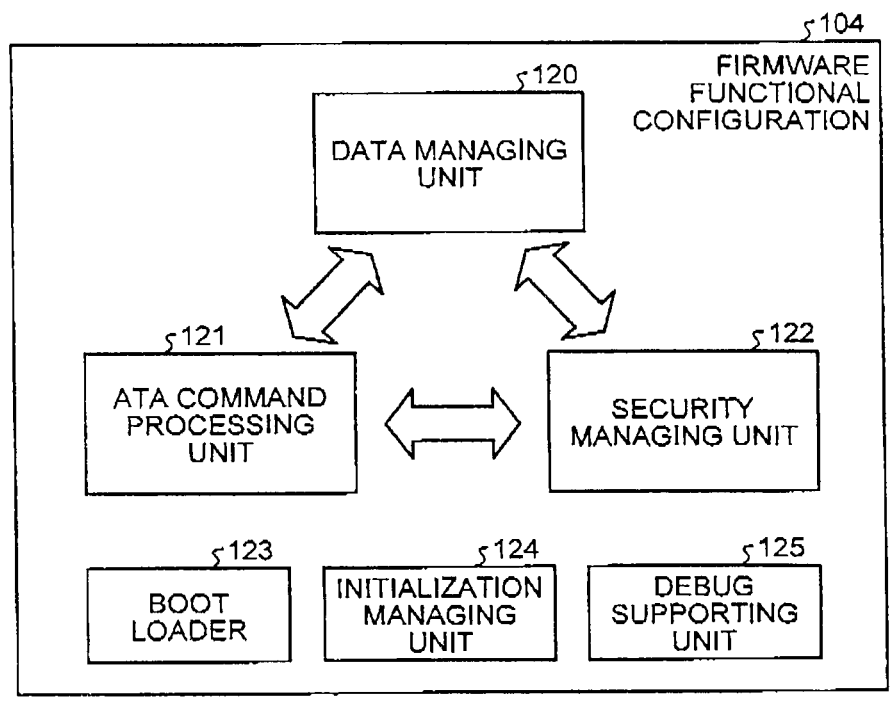
FIG. 3 is a block diagram illustrating a functional configuration example of a processor.

FIG. 3 is a block diagram illustrating a functional configuration example of a firmware realized by the processor 104. Functions of the firmware realized by the processor 104 are roughly classified into a data managing unit 120, an ATA-command processing unit 121, a security managing unit 122, a boot loader 123, an initialization managing unit 124, and a debug supporting unit 125.

The data managing unit 120 controls data transfer between the NAND memory 10 and the RAM 20 and various functions concerning the NAND memory 10, via the NAND controller 113 and the first ECC circuit 112. The ATA-command processing unit 121 performs data transfer processing between the RAM 20 and the host 1 in cooperation with the data managing unit 120 via the ATA controller 111 and the RAM controller 114. The security managing unit 122 manages various kinds of security information in cooperation with the data managing unit 120 and the ATA-command processing unit 121.

The boot loader 123 loads, when power is turned on, each management program (firmware) from the NAND memory 10 onto the SRAM 115. The initialization managing unit 124 performs initialization of each controller and each circuit in the drive control circuit 4. The debug supporting unit 125 processes data for debug supplied from the outside via the RS232C interface. The data managing unit 120, the ATA-command processing unit 121, and the security managing unit 122 are main functional units realized by the processor 104 executing the management programs stored in the SRAM 115.

The data managing unit 120 performs, for example, provision of functions that the ATA-command processing unit 121 requests the NAND memory 10 and the RAM 20 as storage devices (response to various commands such as a Write request, a Cache Flush request, and a Read request from the host), management of a correspondence relation between a logical address given from the host 1 and a physical address of the NAND memory 10, protection of management information by a snapshot and a log, provision of fast and highly efficient data reading and writing functions using the RAM 20 and the NAND memory 10, and ensuring of reliability of the NAND memory 10.

Figure 4:
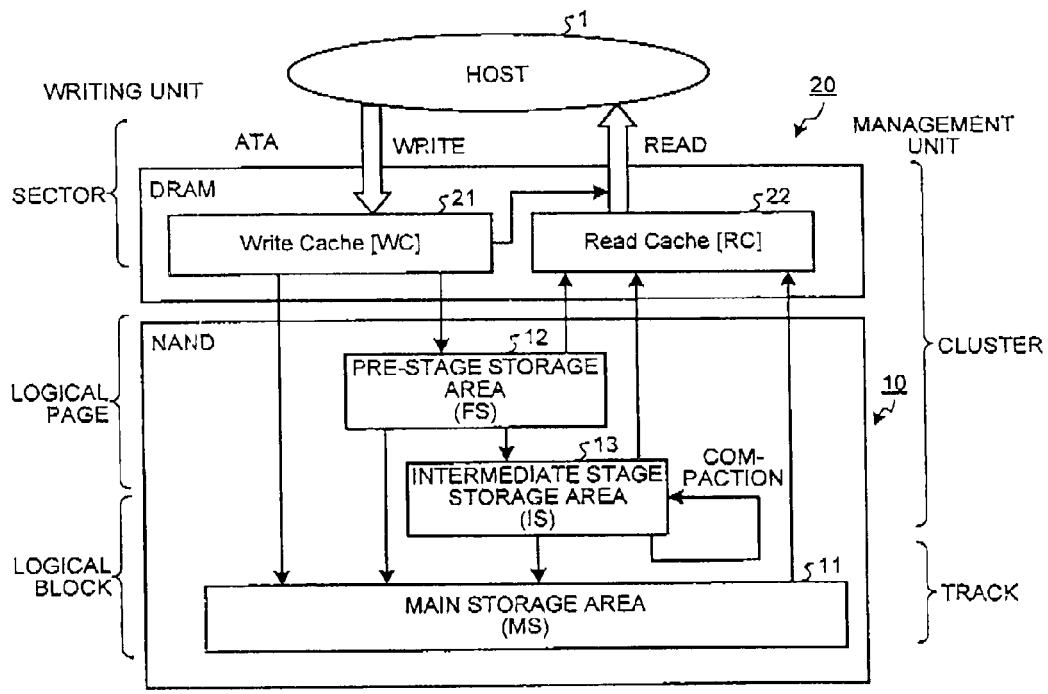
FIG. 4 is a block diagram illustrating a functional configuration formed in a NAND memory and a RAM in the first embodiment.

FIG. 4 illustrates functional blocks formed in the NAND memory 10 and the RAM 20. A write cache (WC) 21 and a read cache (RC) 22 formed in the RAM 20 are interposed between the host 1 and the NAND memory 10. The WC 21 temporarily stores therein Write data from the host 1. The RC 22 temporarily stores therein Read data from the NAND memory 10. The blocks in the NAND memory 10 are allocated to respective management areas of a pre-stage storage area (FS: Front Storage) 12, an intermediate stage storage area (IS: Intermediate Storage) 13, and a main storage area (MS: Main Storage) 11 by the data managing unit 120 in order to reduce an amount of erasing for the NAND memory 10 during writing. The FS 12 manages data from the WC 21 in cluster units, i.e., "small units" and stores small data for a short period. The IS 13 manages data overflowing from the FS 12 in cluster units, i.e., "small units" and stores small data for a long period. The MS 11 manages data from the WC 21, the FS 12, and the IS 13 in track units, i.e., "large units".

Figure 5:
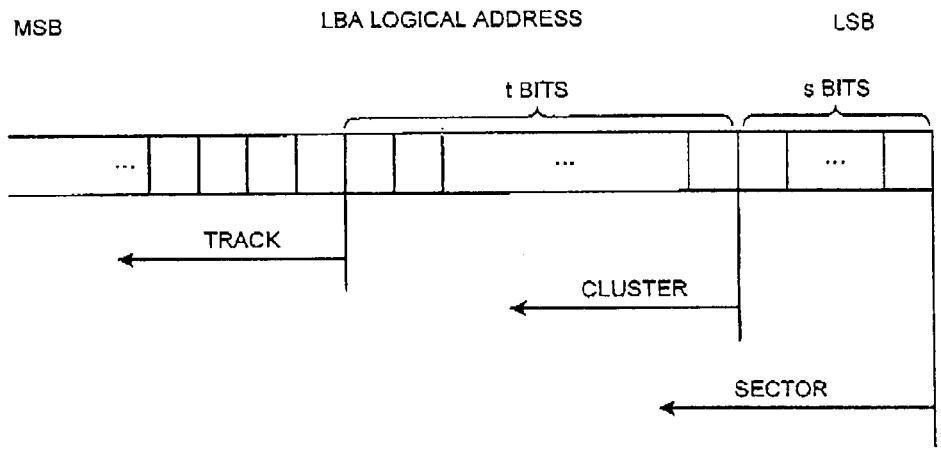
FIG. 5 is a diagram illustrating an LBA logical address.

Specific functional configurations of the respective components shown in FIG. 4 are explained in detail. When the host 1 performs Read or Write on the SSD 100, the host 1 inputs a logical block addressing (LBA) as a logical address via the ATA I/F 2. As shown in FIG. 5, an LEA is a logical address in which serial numbers from zero are attached to sectors (size: e.g., 512 B). In the present embodiment, as management units for the WC 21, the RC 22, the FS 12, the IS 13, and the MS 11, which are the components shown in FIG. 4, a cluster address formed of a bit string equal to or higher in order than a low-order (s+1)th bit of an LBA and a track address formed of a bit string equal to or higher in order than a low-order (s+t+1)th bit of an LBA are defined. In the first embodiment, a track and a logical block have the same size. A logical block is a virtual block associated with a plurality of physical blocks on a chip of the NAND memory 10. In the present embodiment, a logical block is associated with physical blocks for the number of parallel channels (in this case, four channels as shown in FIG. 1). In the similar manner, a logical page is associated with physical pages for four channels. A logical block is selected from physical blocks belonging to the same bank for efficiently using the bank interleave.

<Read Cache (RC) 22>

The RC 22 is an area for temporarily storing, in response to a Read request from the host 1, Read data from the NAND memory 10 (the FS 12, the IS 13, and the MS 11). Data transfer to the host 1 is basically performed from the RC 22. When the latest data is present in the WC 21, data transfer is performed from the WC 21 to the host 1.

<Write Cache (WC) 21>

The WC 21 is an area for temporarily storing, in response to a Write request from the host 1, Write data from the host 1. Data in the WC 21 is managed in cluster units, and writing and management of valid data are performed in sector units. When resources of the WC 21 become insufficient, data stored in the WC 21 is flushed to the NAND memory 10. In the flushing, a track (high-density track) in which the number of valid clusters in the WC 21 is large is flushed to the MS 11 and a track (low-density track) in which the number of valid clusters in the WC 21 is small is flushed to the FS 12. The high density data is data in which valid data is included at over a predetermined rate in a predetermined logical address range and the low density data is data in which valid data is included at less than the predetermined rate in the predetermined logical address range. When free resources of the FS 12 become insufficient, the low density data stored in the WC 21 cannot be flushed to the FS 12 and the Write request from the host 1 is kept waiting. Therefore, when the Write request is kept waiting for a predetermined time or longer due to insufficient free resources of the FS 12, an emergency escape mode (hereinafter, bypass mode) occurs in which all data is forcibly written in the MS 11 regardless of the track density.

<Main Storage Area (MS) 11>

The MS 11 performs data management in track units, and most user data is stored in the MS 11. A track including many valid clusters in the WC 21 (high-density track: track in which the number of valid clusters is a predetermined threshold a or more) is directly written from the WC 21 to the MS 11. Moreover, data that can no longer be managed by the FS 12 and the IS 13 is input to the MS 11. A track of which LBA is the same as that of a track input to the MS 11 is invalidated in a logical block of the MS 11, and this logical block is released. A cluster that belongs to the track of which LBA is the same as that of the track input to the MS 11 is invalidated in the FS 12 or the IS 13, and a logical block in which all clusters are invalidated is released. The MS 11 consists of a plurality of logical blocks of the MLC mode. In the present embodiment, a track and a logical block have the same size, so that additional recording processing performed in the FS 12 and the IS 13 and compaction (processing of collecting only valid clusters to generate a new logical block and releasing an invalid cluster part) performed in the IS 13 are unnecessary in the MS 11. If the track size is smaller than the logical block size, the additional recording processing performed in the FS 12 and the IS 13 and the compaction performed in the IS 13 can be applied to the MS 11.

<Pre-Stage Storage Area (FS) 12>

The FS 12 is a buffer that adapts a first-in first-out (FIFO) management structure in which data is managed in cluster units, and input is performed in units of logical page in which a plurality of clusters is collected. A track having small number of valid clusters (low-density track: track in which the number of valid clusters is less than the predetermined threshold α) in the WC 21 is written in the FS 12. The FS 12 has, for example, the FIFO management structure in which logical blocks are arranged in the order of data writing. When a cluster of which LBA is the same as that of a cluster present in the FS 12 is input to the FS 12, it is sufficient to invalidate the cluster in the FS 12, and rewriting is not performed. A cluster of which LBA is the same as a cluster input to the FS 12 is invalidated in a logical block, and a logical block in which all clusters are invalidated is released. A cluster, which is stored in a logical block and reaches the end of the FIFO management structure of the FS 12, is regarded as a cluster with a low possibility of rewriting from the host 1 and the logical block as a whole is moved to the IS 13 under the management of the IS 13. In the present embodiment, the FS 12 consists of a plurality of logical blocks of the pseudo SLC mode to speed up writing. The FS 12 can consist of a plurality of logical blocks of the MLC mode. Data with a high update frequency is invalidated when passing through the FS 12 and only data with a low update frequency overflows from the FS 12, so that the FS 12 can separate data with a low update frequency from data with a high update frequency. Consequently, it is possible to lower the possibility that the compaction occurs frequently in the IS 13 of the subsequent stage.

<Intermediate Stage Storage Area (IS) 13>

The IS 13 is a buffer for storing a cluster with a low possibility of rewriting, and management of data is performed in cluster units in the same manner as the FS 12. When a cluster of which LBA is the same as that of a cluster present in the IS 13 is input to the FS 12 and the IS 13, it is sufficient to invalidate the cluster in the IS 13, and rewriting is not performed. In the similar manner to the FS 12, the IS 13 has a list management structure in which logical blocks are arranged in order from a logical block in which data is written first (from a logical block that is relocated from the FS 12 first); however the IS 13 performs the compaction, which is different from the FS 12. When the capacity of the IS 13 is saturated or management tables for the FS 12 and the IS 13 are saturated, the compaction (collecting valid clusters from the IS 13 and writing it back to the IS 13) or defragmentation (integrating clusters of the FS 12 and the IS 13 into a track and flushing it to the MS 11) is performed. In the present embodiment, the IS 13 consists of a mixture of logical blocks of the MLC mode and the pseudo SLC mode. In other words, a block relocated from the FS 12 to the IS 13 is a logical block of the pseudo SLC mode; however, the block is rewritten to a logical block of the MLC mode when performing the compaction in the IS 13. When the FS 12 consists of logical blocks of the MLC mode, the IS 13 also consists of only logical blocks of the MLC mode.

Figure 6:
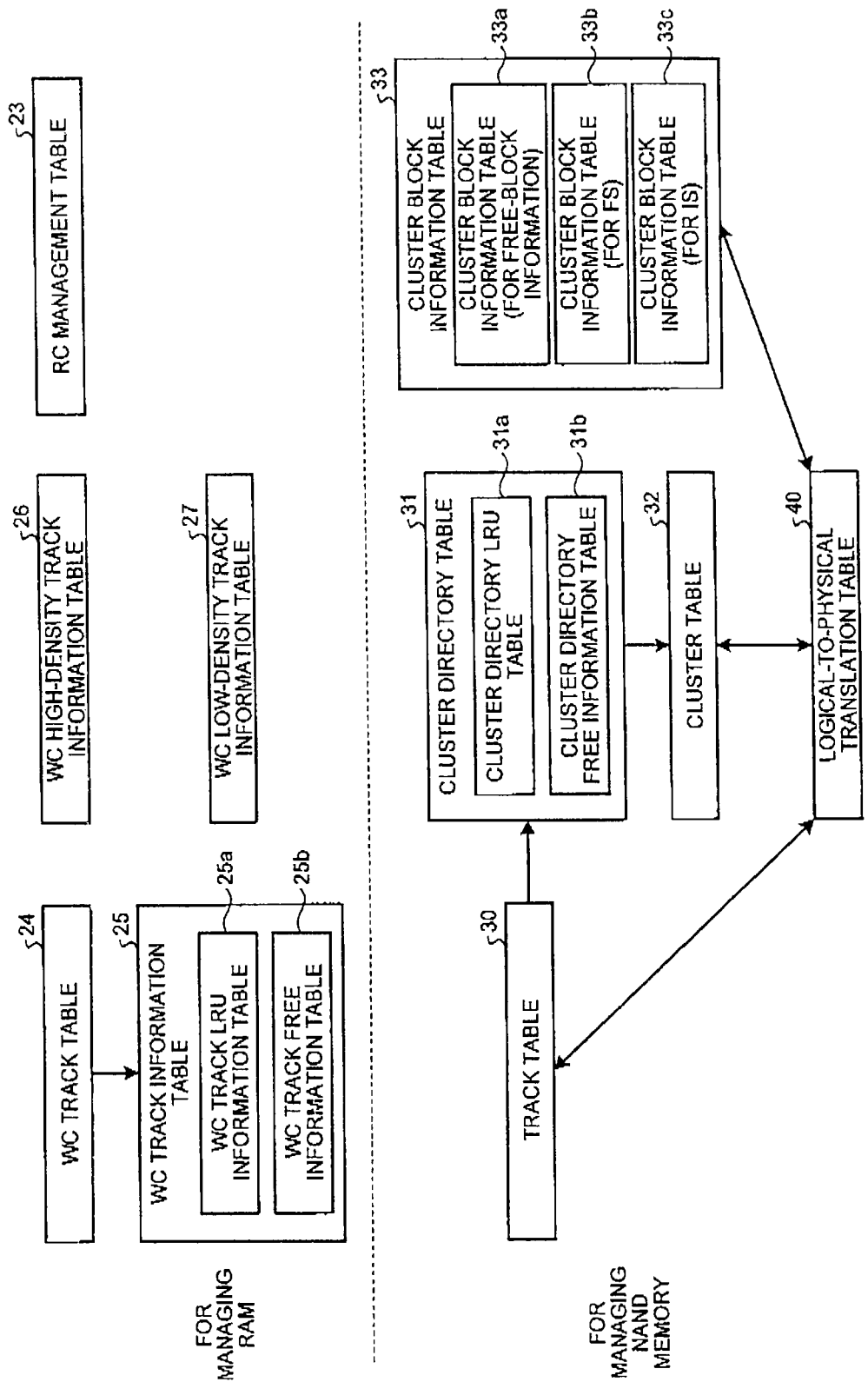
FIG. 6 is a diagram illustrating a configuration example of management tables used in a data managing unit.

FIG. 6 illustrates management tables for the data managing unit 120 to control and manage the respective components shown in FIG. 4. The table for managing the RAM 20 includes an RC management table 23, a WC track table 24, a WC track information table 25, a WC high-density track information table 26, a WC low-density track information table 27, and the like. The table for managing the NAND memory 10 includes a track table 30, a cluster directory table 31, a cluster table 32, a cluster block information table 33, a logical-to-physical translation table 40, and the like.

<RC Management Table 23>

The RC management table 23 is for managing data transferred from the NAND memory 10 to the RC 22.

<WC Track Table 24>

The WC track table 24 is a table to look up WC track information concerning data stored in the WC 21 from an LBA, and includes a plurality of entries (tags) for each index that is a few bits of least significant bit (LSB) of a track address of the LBA. Each tag stores an LBA track address and a pointer to the WC track information corresponding to the track address.

<WC Track Information Table 25>

The WC track information table 25 includes a WC track least recently used (LRU) information table 25a for managing the time ordering of accessed WC track information by a bi-directional list using LRU and a WC track free information table 25b that manages a free WC track information number. When flushing data from the WC 21 to the NAND memory 10, the oldest accessed track is taken by using the WC track LRU information table 25a.

WC track information corresponds to one of a plurality of tracks present in the WC 21.

WC track information includes (1) a track address present in the WC 21, the number of valid clusters in the WC 21 in a track, information indicating whether each cluster is valid, and intra-WC cluster position information indicating a position of each cluster in the WC 21, (2) information (sector bit map) indicating which sector stores therein valid data among a plurality of sectors included in one cluster, (3) track state information (e.g., valid, invalid, during data transfer from ATA, and during writing in the NAND memory), and the like. In the WC track information, LSB (t) bits of a cluster address present in the own track are managed by a storage position at which a valid cluster is present; however, the method of managing a cluster address is arbitrary. For example, the LSB (t) bits themselves of the cluster address present in the own track can be managed.

<WC High-Density Track Information Table 26>

The WC high-density track information table 26 is for managing information on a high-density track to be written in the MS 11 and manages WC track information concerning a high-density track and the number thereof.

<WC Low-Density Track Information Table 27>

The WC low-density track information table 27 is for managing information on a low-density track to be written in the FS 12 and manages the total number of clusters of a low-density track.

<Track Table 30>

The track table 30 is a table for obtaining track information from a track address of an LBA. Track information includes (1) a logical block address (information indicating a logical block in which data of a track is stored), (2) a cluster directory number (information that becomes valid when at least part of data in a track is stored in the FS 12 or the IS 13 and that indicates a table number of a cluster directory table that is present for each track when data in a track is stored in the FS 12 or the IS 13), and (3) the number of FS/IS clusters (information that indicates the number of clusters in a track stored in the FS 12 or the IS 13 and is used for determining whether to perform the defragmentation).

<Cluster Directory Table 31>

The cluster directory table 31 is an intermediate table for tracing to a logical block when data in a track is stored in the FS 12 or the IS 13. The cluster directory table 31 is provided for each track. Cluster directory information registered in each cluster directory table 31 consists of an array of information (cluster table number information) indicating a table number of the cluster table 32. One piece of information is selected from among a plurality of pieces of the cluster table number information arrayed in one cluster directory table 31 by upper few bits in LSB (t) bits of a cluster address of an LBA.

The cluster directory table 31 includes a cluster directory LRU table 31a for managing the time ordering of cluster directory information (array of cluster table number information) with a writing time as a reference together with a corresponding track address by a bi-directional list using LRU and a cluster directory free information table 31b that manages a free cluster directory together with a corresponding track address by a bi-directional list.

<Cluster Table 32>

The cluster table 32 is a table that relates to the cluster directory table 31 and manages a cluster position in a logical block at which data is stored when the data in a track is stored in the FS 12 or the IS 13. The cluster table 32 is referred to from the track table 30 indirectly via the cluster directory table 31. The cluster table 32 is actually an array of (logical block address+cluster position) for a plurality of clusters. One piece of information is selected from among a plurality of pieces of (logical block address+cluster position) arrayed in one cluster table 32 by lower few bits in LSB (t) bits of a cluster address of an LBA. The cluster table 32 also includes a cluster block information number to be described later and information about a cluster position therein as an array.

<Cluster Block Information Table 33>

A cluster block is a block that stores therein data in cluster units among logical blocks. Cluster block information is information for managing logical blocks of the FS 12 and the IS 13 and indicates what type of cluster is present in logical blocks. A plurality of pieces of cluster block information is coupled in the order of FIFO in the FS 12 and the IS 13 as a bi-directional list.

Cluster block information includes (1) a logical block address, (2) the number of valid clusters, and (3) an LBA of a cluster included in a logical block.

The cluster block information table 33 includes a cluster block information table 33a for managing free-block information, a cluster block information table 33b for the FS 12, and a cluster block information table 33c for the IS 13. The cluster block information table 33a manages unused cluster block information, the cluster block information table 33b manages cluster block information included in the FS 12, and the cluster block information table 33c manages cluster block information included in the IS 13. Each of the cluster block information tables 33a to 33c is managed as a bi-directional list. The principal use of the cluster block information table 33 is the compaction of the IS 13. The cluster block information table 33 is used to check what type of cluster is stored in a logical block as a compaction target and rewrite data to a different location.

<Logical-to-Physical Translation Table 40>

The logical-to-physical translation table 40 is a table for managing information concerning translation between a logical block address and a physical block address and the life. The logical-to-physical translation table 40 includes information indicating a plurality of physical block addresses belonging to a logical block, information indicating the number of times of erasing of a logical block address, information about a cluster block information number, and the like, for each logical block address. For rewriting data of a certain LBA to a different location, the LBA in an original cluster block needs to be invalidated, so that it is needed to trace to a cluster block from the LBA. Therefore, an identifier of cluster block information is stored in management information of a logical block managed by the logical-to-physical translation table 40.

With the management information managed by each management table, an LBA used in the host 1, a logical NAND address (logical block address+offset) used in the SSD 100, and a physical NAND address (physical block address+offset) used in the NAND memory 10 can be associated with each other, so that data exchange between the host 1 and the NAND memory 10 can be performed.

The tables for NAND memory management (such as the track table 30, the cluster directory table 31, the cluster table 32, the cluster block information table 33, and the logical-to-physical translation table 40 in FIG. 6) among the above management tables are stored in a specific area of the nonvolatile NAND memory 10. At the time of start-up, each management table stored in the NAND memory 10 is loaded onto a work area of the RAM 20, which is used by the data managing unit 120, so that each management table is updated. Each management table (master table) loaded on the RAM 20 needs to be restored to a state before the power is turned off even when the power is turned off, so that a master table and log that is a change difference of the master table are stored in the nonvolatile NAND memory 10 at appropriate timing.

<Read Processing>

Next, the read processing is briefly explained. When a read command and an LBA as a read address are input from the ATA-command processing unit 121, the data managing unit 120 searches through the RC management table 23 and the WC track table 24 to check whether data corresponding to the LBA is present in the WC 21 or the RC 22. In the case of a cache hit, the data managing unit 120 reads out data in the WC 21 or the RC 22 corresponding to the LBA and sends the data to the ATA-command processing unit 121.

If there is no hit in the RC 22 or the WC 21, the data managing unit 120 searches in which part of the NAND memory 10 data as a search target is stored. If the data is stored in the MS 11, the data managing unit 120 traces the LBA→the track table 30→the logical-to-physical translation table 40 to obtain the data in the MS 11. On the other hands, if the data is stored in the FS 12 or the IS 13, the data managing unit 120 traces the LBA→the track table 30→the cluster directory table 31→the cluster table 32 the logical-to-physical translation table 40 to obtain the data in the FS 12 or the IS 13.

<Write Processing>

(Processing in the WC 21)

Figure 7:
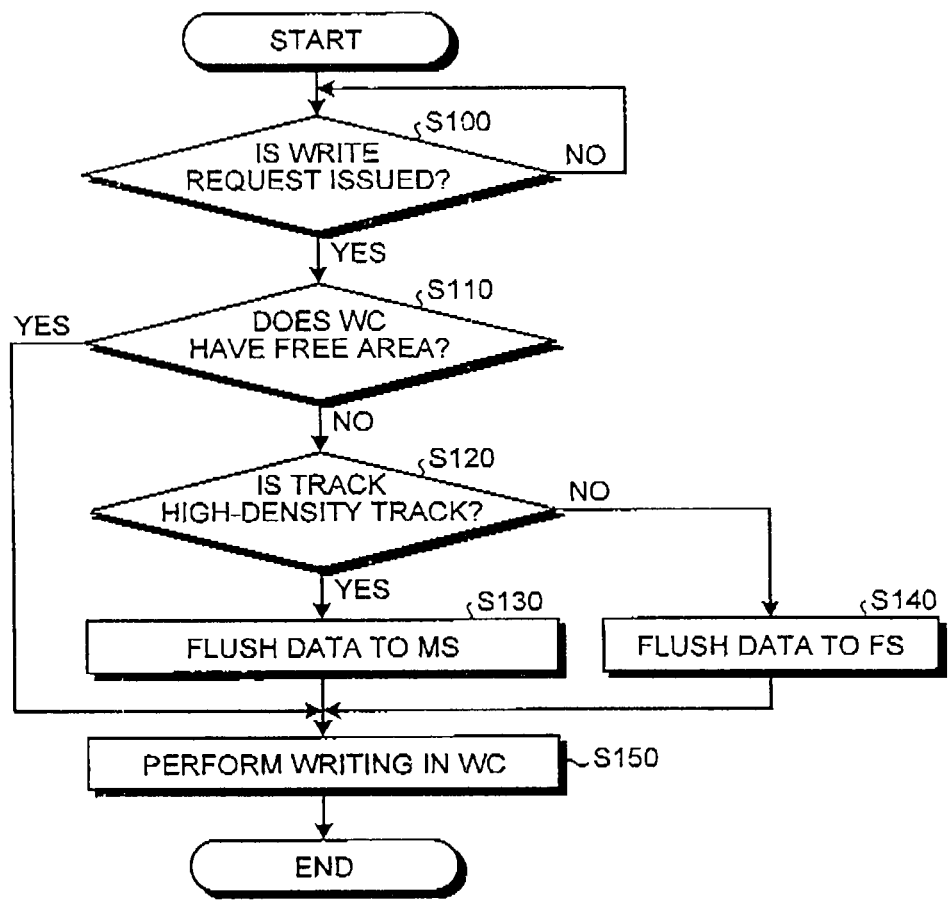
FIG. 7 is a flowchart illustrating write processing in a WC.

Next, the write processing is briefly explained in accordance with a flowchart shown in FIG. 7. In the write processing, when a write command and an LBA as a write address are input from the ATA-command processing unit 121 (Step S100), the data managing unit 120 writes data specified by the LBA in the WC 21. Specifically, the data managing unit 120 determines whether there is a free area corresponding to the write request in the WC 21 (Step S110), and writes the data specified by the LBA in the WC 21 when there is a free area in the WC 21 (Step S150).

On the other hand, when the WC 21 has no free area, the data managing unit 120 flushes data from the WC 21 by referring to various management tables for RAM management to write the flushed data in the NAND memory 10, thereby generating a free area. Specifically, the data managing unit 120 checks the number of valid clusters in tracks (Step S120), determines a track in which the number of valid clusters is less than a predetermined percentage $\alpha$ as a low-density track, and flushes it as cluster size data to the FS 12 as a flush destination (Step S140). When the flush destination is the FS 12, a valid cluster in the track is written in logical page units.

In the determination at Step S120, when it is determined that the number of valid clusters in a track is equal to or more than the predetermined percentage $\alpha$, this track is determined as a high-density track and is flushed as track size data to the MS 11 as a flush destination (Step S130). When the flush destination is the MS 11, the data of the track size is directly written in the whole logical block. When there is a plurality of logical blocks as a writing target, the double speed mode or the bank interleave is used to improve the transfer efficiency.

In this manner, after generating a free area in the WC 21, the data specified by the TUBA is written in the WC 21 (Step S150). Various management tables for RAM management are updated in accordance with the data written in the WC 21 and the data flushing to the NAND memory 10.

(Writing from the WC 21 to the MS 11)

Next, the write processing of a high-density track from the WC 21 to the MS 11 is explained in accordance with FIG. 8 and FIG. 9. FIG. 8 is a flowchart illustrating an operation procedure thereof, and FIG. 9 is a schematic diagram illustrating an operation concept thereof.

Writing to the MS 11 is performed in the following procedures. The data managing unit 120 can select a plurality of high-density tracks on which writing can be performed in parallel by utilizing the bank interleave in addition to a high-density track that is a flush target.

1. The data managing unit 120 generates a data image of a track in the RAM 20 (padding processing) (Step S200). Specifically, a cluster that is not present in the WC 21 and a cluster that holds not all of sectors in the WC 21 are read out from the NAND memory 10 to be integrated with data in the WC 21.

2. The data managing unit 120 secures a logical block (track block) from a CFB for the MS 11 (Step S210). The track block is a block that stores therein data in track units among logical blocks.

3. The data managing unit 120 writes the data image of the track generated at Step S200 in the logical block secured at Step 210 (Step S220).

4. The data managing unit 120 checks the track information from the LBA of the track, associates the track information with a logical block address corresponding to the written logical block, and registers it in a required table for NAND memory management (Step S230).

5. The data managing unit 120 invalidates old data in the WC 21 and the NAND memory 10 (Step S240). Specifically, the data managing unit 120 causes cache data in the WC 21 flushed to the MS 11 and data in the NAND memory 10 used in the padding processing at Step S200 to be an invalid state from a valid state on a management table to invalidate them.

(Writing from the WC 21 to the FS 12)

Figure 10:
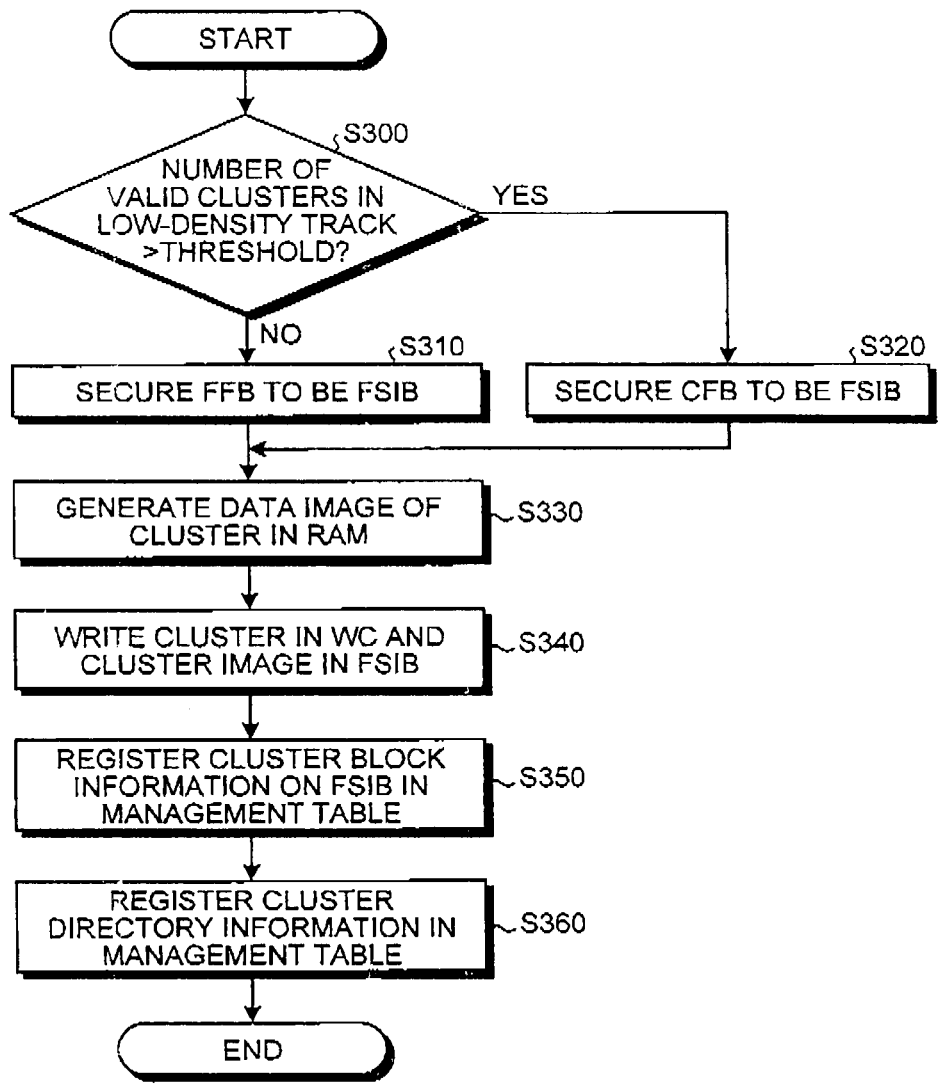
FIG. 10 is a flowchart illustrating an operation procedure of the write processing of a low-density track from the WC to an FS.
Figure 11:
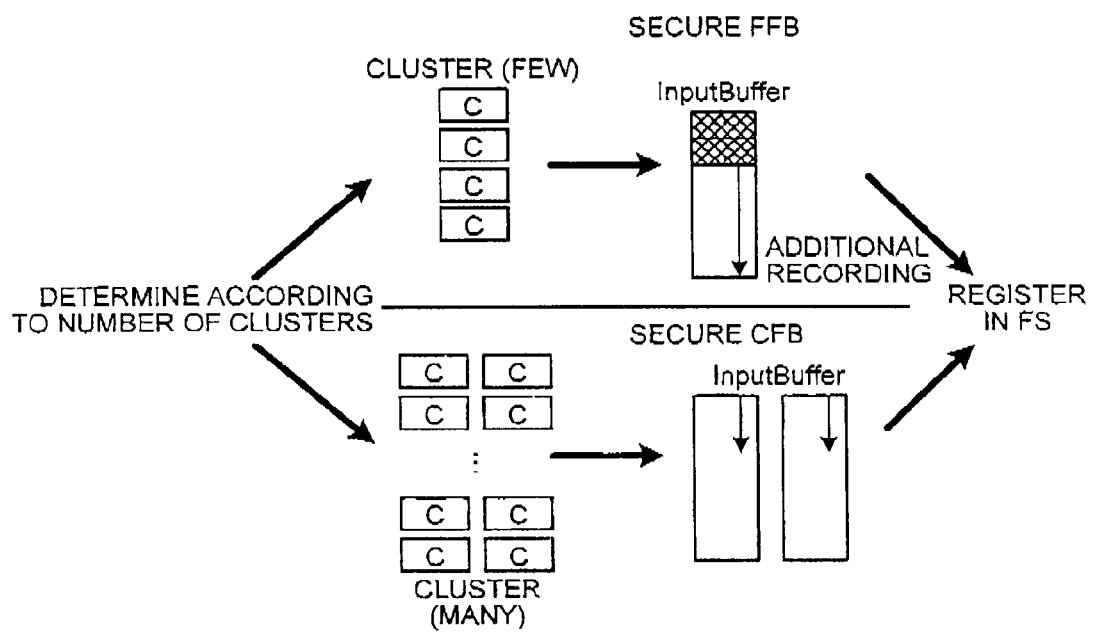
FIG. 11 is a schematic diagram illustrating an operation concept of the write processing of a low-density track from the WC to the FS.

Next, the write processing of a low-density track from the WC 21 to the FS 12 is explained in accordance with FIG. 10 and FIG. 11. FIG. 10 is a flowchart illustrating an operation procedure thereof, and FIG. 11 is a schematic diagram illustrating an operation concept thereof.

Writing to the FS 12 is performed by generating a data image of clusters in the RAM 20 (padding processing) and performing writing in logical page units in a newly-secured logical block (cluster block) by using the pseudo SLC mode. As the logical block to be secured, an FFB having logical pages capable of writing equal to or more than a data image to be written is prioritized. If an FFB is not present, a CFB is used. Writing to the FS 12 is performed in the following procedures.

A logical block (cluster block) for writing data of a low-density track from the WC 21 to the FS 12 is called an FS input buffer (FSIB). The data managing unit 120 can involve other low-density tracks in addition to the low-density track that is a flush target so that an amount of cluster data to be written coincides with a logical block border of the pseudo SLC mode.

1. The data managing unit 120 determines a total amount of data in the low-density track input from the WC 21 (Step S300). When the determined total amount of data is small, i.e., when the number of valid clusters is smaller than a predetermined threshold, the data managing unit 120 secures an FFB in which the data can be written to be an FSIB (Step S310).

2. When the data managing unit 120 determines that the total amount of data in the low-density track input from the WC 21 is large, i.e., when the number of valid clusters is equal to or larger than the predetermined threshold, the data managing unit 120 secures a CFB to be an FSIB (Step S320). At this time, a plurality of logical blocks capable of writing data in parallel is secured to be an FSIB.

3. The data managing unit 120 generates a data image of clusters to be written in the RAM 20 (Step S330). Specifically, for a cluster that holds not all of sectors in the WC 21, the data managing unit 120 reads out data of a sector that is not present in the WC 21 from the NAND memory 10 to be integrated with the data of the sectors in the WC 21.

4. The data managing unit 120 writes the clusters in the WC 21 and the cluster image generated in the work area in the FSIB (Step S340).

5. The data managing unit 120 adds the cluster block information on this FSIB to the cluster block information table 33*b* for the FS 12 (Step S350).

6. The data managing unit 120 reinserts the cluster directory information on the low-density track written in the FSIB into the end of the cluster directory LRU table 31*a* together with a corresponding track address (Step S360).

(Relocation from the FS 12 to the IS 13)

Figure 12:
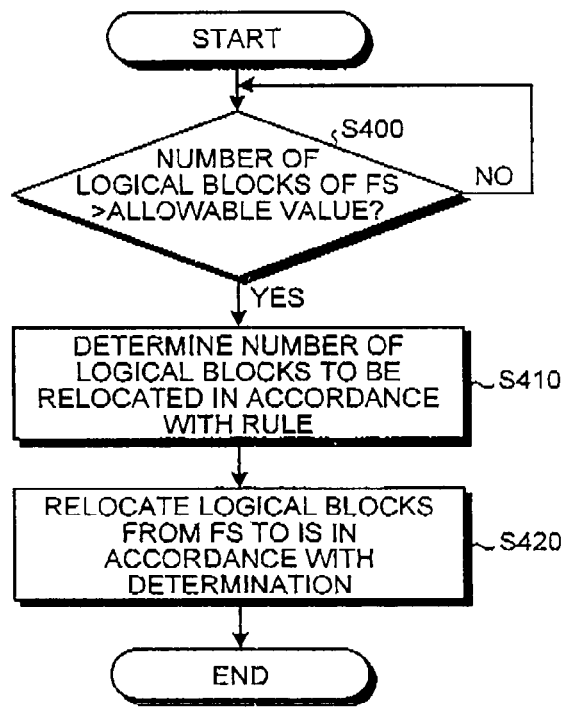
FIG. 12 is a flowchart illustrating an operation procedure of data relocation from the FS to the IS.
Figure 13:
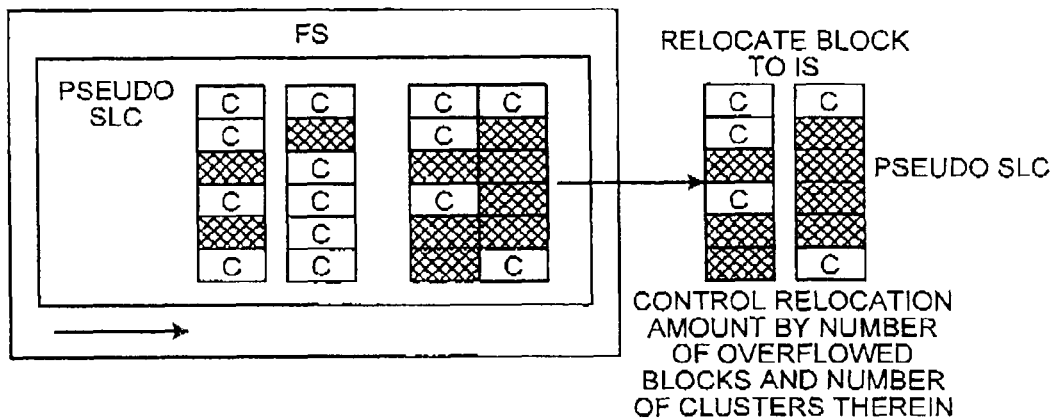
FIG. 13 is a schematic diagram illustrating an operation concept of the data relocation from the FS to the IS.

Next, data relocation from the FS 12 to the IS 13 is explained in accordance with FIG. 12 and FIG. 13. FIG. 12 is a flowchart illustrating an operation procedure thereof, and FIG. 13 is a schematic diagram illustrating an operation concept thereof.

The data managing unit 120 determines whether the number of logical blocks under the management of the FS 12 exceeds a specific maximum number of logical blocks (Step S400). When the number of logical blocks under the management of the FS 12 exceeds the specific maximum number of logical blocks, as shown in FIG. 13, the data managing unit 120 relocates a logical block that is overflowed from the FS 12 directly to the IS 13. In the present embodiment, the FS 12 consists of a plurality of logical blocks of the pseudo SLC mode, and a logical block of the pseudo SLC mode is directly relocated from the FS 12 to the IS 13. The number of logical blocks to be relocated in each processing is determined by the following rule in accordance with the number of valid clusters in the overflowed logical block and the like (Step S410).

A logical block that is relocated is added from the oldest logical block of the FS 12 so that the total number of clusters in the overflowed logical block becomes close to the border of one logical block of the MLC mode, i.e., close to the number ($2^t$) of clusters for one logical block or a multiple ($m \times 2^t$: m is a natural number) thereof. For example, when the number of clusters in the overflowed logical block is a value between $2^t$ and $2^{t+1}$, the number of logical blocks as a relocation target is increased so that the number of clusters becomes close to $2^{t+1}$ (including $2^{t+1}$). The number of clusters is caused to be close to the border of one logical block of the MLC mode to accommodate valid clusters as many as possible in a logical block after the compaction.

When the number of clusters exceeds the number of clusters z that can be subjected to the compaction simultaneously in the IS 13, the number of logical blocks is set so that the number of clusters is equal to or smaller than this number of clusters z.

The upper limit is set to the number of logical blocks to be relocated in one processing. This limitation is set for preventing temporary increase of the number of logical blocks under the management of the IS 13.

The logical blocks as a relocation target determined in this manner are relocated from the FS 12 to the IS 13 (Step S420).

(Compaction and Defragmentation in the IS 13)

Figure 14:
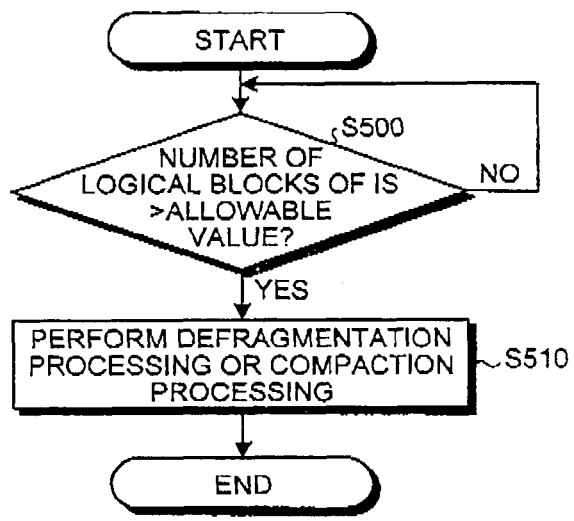
FIG. 14 is a flowchart illustrating an operation procedure of defragmentation processing and compaction processing in the IS.

Next, the compaction processing and the defragmentation processing in the IS 13 are explained in accordance with a flowchart shown in FIG. 14.

The data managing unit 120 determines whether the number of logical blocks under the management of the IS 13 exceeds a specific maximum number of logical blocks (Step S500). When the number of logical blocks under the management of the IS 13 exceeds the maximum number of logical blocks, the data managing unit 120 performs the data relocation (defragmentation processing) to the MS 11 and the compaction processing to suppress the number of logical blocks under the management of the IS 13 to be equal to or less than the maximum number of logical blocks (Step S510). When a data erasing unit (logical block) and a data management unit (cluster) are different, according to the progress of rewriting of the NAND memory 10, logical blocks are made porous by invalid data. When the logical blocks in such a porous state increase, substantially usable logical blocks decrease and a storage area of the NAND memory 10 cannot be effectively used. Therefore, processing called compaction of collecting valid clusters and rewriting it in a different logical block is performed. The defragmentation processing is processing of integrating clusters of the FS 12 and the IS 13 into a track and flushing it to the MS 11. As the defragmentation processing, it is applicable to integrate clusters only in the IS 13 into a track and flush it to the MS 11.

Next, the essential part of the present embodiment is explained. In the above SSD 100, the FS 12 and the IS 13 that function as a buffer in the NAND memory 10 have constraints on resources. In other words, the NAND memory 10 generally includes a storage area (called margin area) that cannot be seen from the host 1 in addition to a user-data storage area (called reserved area) that can be seen from the host 1. The reserved area is an area that can be specified by an LBA as a logical address used in the host 1 and corresponds to the MS 11. The margin area is used as a storage area for the FS 12 and the IS 13, a storage area for various management tables shown in FIG. 6, and the like. In this manner, the margin area in the NAND memory 10 is an area that cannot be seen from a user, so that not many storage areas can be allocated to this margin area and the margin area has constraints on its resources.

As described above, because the FS 12 and the IS 13 have constraints on resources, an amount of free resources of the FS 12 and the IS 13 needs to be kept as constant as possible. Therefore, when there is no request from the host 1 for a certain period of time and the state transitions to an idle state, if the data managing unit 120 determines that clusters exceeding a predetermined number are stored in the FS 12 or the IS 13, the data managing unit 120 performs NAND organizing including the data relocation from the FS 12 to the IS 13, the compaction processing, the defragmentation processing, and the like. The NAND organizing is performed as a background process transparently to the host 1, and if there is an access request or a transition request to a power-saving mode, such as standby and sleep, from the host 1, the NAND organizing is immediately interrupted to receive the request even in the middle of the NAND organizing.

When the system is configured such that the execution state of the NAND organizing is not notified to the host 1, the host 1 cannot recognize whether the NAND organizing is in execution. In such system, when sequential write requests are issued from the host 1 during execution of the NAND organizing, the NAND organizing is kept interrupted. Therefore, when data flushing from the WC 21 to the NAND memory 10 occurs, free resources in the FS 12 may become insufficient, which results in increasing the probability to transition to the above-described bypass mode in which even a low-density track is forcibly recorded in the MS 11 for storing a high-density track, thereby reducing a command response and the writing efficiency. Moreover, when there is a standby or sleep transition request immediately after performing a write request from the host 1, the similar phenomenon occurs in the write request after recovering from continuous interruption of the NAND organizing (including the case in which power is turned off from this state).

In the present embodiment, new commands are defined: a command (hereinafter, organizing-execution request command EXE_ORG and organizing-stop request command ABT_ORG) in which the host 1 causes the SSD 100 to perform/stop the organizing of the NAND memory 10; and a command in which the host 1 checks the execution state of the organizing of the NAND memory 10, i.e., a command (hereinafter, organizing-state notification request command RQSTS_ORG) in which the host 1 requests notification of the execution state of the organizing. When the organizing-state notification request command RQSTS_ORG is input from the host 1, the SSD 100 notifies the host 1 of the organizing state of the NAND memory 10 as a response thereto.

First, the NAND organizing is explained in detail. In the present embodiment, the NAND organizing includes the data relocation from the FS 12 to the IS 13, the defragmentation, and the compaction. In the present embodiment, for example, when there is no request from the host 1 for a certain period of time and the state transitions to an idle state or when the organizing-execution request command EXE_ORG is received from the host 1, if free resources of the FS 12 or the IS 13 are insufficient or free resources of the management tables for cluster management (the cluster directory table 31 and the cluster table 32) are insufficient, the NAND organizing is performed.

FIG. 15 is a diagram illustrating an example of a relationship between a plurality of parameters (NAND resource names) for triggering the NAND organizing, two thresholds (target value and upper limit), and a specific action of the organizing. The parameters (resource names) for triggering the NAND organizing include the number of FS blocks (the number of logical blocks belonging to the FS 12), the number of IS blocks (the number of logical blocks belonging to the IS 13), a cluster directory (occupied capacity of the cluster directory table 31), and a cluster table (occupied capacity of the cluster table 32). These parameters for triggering the NAND organizing are also called a NAND resource usage (used amount of resource).

Two thresholds (target value and upper limit) are set to each of these four parameters for triggering the NAND organizing. In FIG. 15, the "maximum value" set to each parameter represents substantially the maximum value that each parameter can take, and does not have a meaning as a threshold for triggering the NAND organizing. The "upper limit" represents that the NAND organizing is continued until the amount of resource in use reaches at least this upper limit or less. If the used amount of resource exceeds the upper limit, flushing from the WC 21 to the FS 12 cannot be performed and the mode transitions to the bypass mode.

Therefore, the NAND organizing is performed so that the used amount of resource becomes the upper limit or less after flushing from the WC 21 to the NAND memory 10. The "target value" represents that the NAND organizing is continued until reaching this target value or less. For ensuring resources with margin, the NAND organizing is performed so that the used amount of resource becomes the target value or less at a time when NAND memory 10 is in an idle state previously. The maximum value, the upper limit, and the target value have a magnitude relation of Xmax>Xlmt>Xtgt, Ymax≧Ylmt>Ytgt, Zmax>Zlmt>Ztgt, and Wmax>Wlmt≧Wtgt.

In the present embodiment, as shown in FIG. 15, when the number of FS blocks exceeds the upper limit Xlmt or the target value Xtgt, the data relocation from the FS 12 to the IS 13 is performed, when the number of IS blocks exceeds the upper limit Ylmt or the target value Ytgt, the compaction is performed, when the occupied capacity of the cluster directory table 31 exceeds the upper limit Zlmt or the target value Ztgt, the defragmentation is performed, and when the occupied capacity of the cluster table 32 exceeds the upper limit Wlmt or the target value Wtgt, the defragmentation is performed. When the number of FS blocks exceeds the upper limit Xlmt or the target value Xtgt, it is applicable to perform the defragmentation in addition to the data relocation from the FS 12 to the IS 13. When the number of IS blocks exceeds the upper limit Ylmt or the target value Ytgt, it is applicable to perform the defragmentation in addition to the compaction. When the management tables for cluster management (the cluster directory table 31 and the cluster table 32) exceed the upper limit or the target value, it is applicable to perform the compaction, and the action performed when the used amount of resource exceeds the threshold is not limited to those shown in FIG. 15.

FIG. 16 illustrates an example of an FIS (Frame Instruction Structure) of Register Host to Device for issuing an instruction from a host to a device in the case of applying the organizing-execution request command EXE_ORG, the organizing-stop request command ABT_ORG, and the organizing-state notification request command RQSTS_ORG to a SATA (Serial ATA) interface. In the FIS shown in FIG. 16, when the value of the feature field is 01$h$, the organizing execution request (the organizing-execution request command EXE_ORG) is specified, when the value is 02$h$, the organizing-state notification request (the organizing-state notification request command RQSTS_ORG) is specified, and when the value is 03$h$, the organizing stop request (the organizing-stop request command ABT_ORG) is specified.

In the command field, a predetermined command code common in the organizing-execution request command EXE_ORG, the organizing-stop request command ABT_ORG, and the organizing-state notification request command RQSTS_ORG is specified. The count field is N/A (not applicable). In the LBA field, it is specified which one of two modes included in the organizing-execution request command EXE_ORG is performed. Specifically, in the case where the value of the feature field is 01$h$, when the value of the LBA field is 01$h$, the NAND organizing execution in a short mode (short time mode) is specified, and when the value of the LBA field is 02$h$, the NAND organizing execution in a long mode (long time mode) is specified. When the short mode is specified, the NAND organizing is performed so that the used amount of resource of the NAND memory 10 becomes the upper limit or less. When the long mode is specified, the NAND organizing is performed so that the used amount of resource of the NAND memory 10 becomes the target value or less.

FIG. 17 illustrates an example of an FIS of Register Host to Device for notifying a host of an execution result from a device in the case of applying the organizing-state notification request command RQSTS_ORG to a SATA interface. In the FIS shown in FIG. 17, the feature field indicates the execution state of the NAND organizing. When the value of the feature field is 00$h$, the NAND organizing is currently in a "non-executing state", when the value is 01$h$, the NAND organizing is currently in an "interrupted state", and when the value is 02$h$, the NAND organizing is currently in an "executing state". The initial state is the "non-executing state". When the NAND organizing is started (resumed), the state becomes the "executing state". When the NAND organizing is interrupted, the state becomes the "interrupted state". When the NAND organizing is completed, the state becomes the "non-executing state". In the command field, the same command code as that specified in the command field shown in FIG. 16 is specified.

In FIG. 17, the count field is a field representing the content of the NAND organizing, and the count field includes an execution target resource of the NAND organizing and an execution-target-resource threshold (one of the thresholds, i.e., the upper limit and the target value, for which the NAND organizing is performed). If the execution state of the NAND organizing is the "non-executing state" in the feature field, the count field is not determined. In the case of FIG. 17, the number of FS blocks and the number of IS blocks are employed as the target resource of the NAND organizing. The count value of 00$h$ indicates that the NAND organizing is performed for making the number of FS blocks be the upper limit Xlmt or less, the count value of 01$h$ indicates that the NAND organizing is performed for making the number of FS blocks be the target value Xtgt or less, the count value of 10$h$ indicates that the NAND organizing is performed for making the number of IS blocks be the upper limit Ylmt or less, and the count value of 11$h$ indicates that the NAND organizing is performed for making the number of IS blocks be the target value Ytgt or less. When the cluster management tables such as the cluster directory table 31 and the cluster table 32 are also included as the target resource of the NAND organizing, the format of the count field is changed so that the content of the organizing of these NAND resources is recognized.

In FIG. 17, the LBA field is the field representing the progress of the NAND organizing. If the execution state of the NAND organizing is the "non-executing state" in the feature field, the LBA field is not determined. The progress of the NAND organizing can be calculated from the current amount of resource based on the value from the maximum value of each used amount of resource as a target of the NAND organizing to the threshold of the amount of resource in the NAND organizing being 100%. As the progress, it is possible to notify the host of any one of or all of (1) progress with respect to each resource threshold (maximum value→upper limit or upper limit→target value), (2) progress in units of resource (maximum value→target value), and (3) progress of the whole NAND organizing based on the total value obtained by weighting each resource.

For example, in the case where the NAND-organizing target resource is "the number of FS blocks" and "the number of IS blocks", if it is assumed that the resource setting of the number of FS blocks is such that the maximum value is 1000, the upper limit is 800, and the target value is 500, and the resource setting of the number of IS blocks is such that the maximum value is 1000, the upper limit is 900, and the target value is 800, when the number of currently-used FS blocks is 900 and the number of currently-used IS blocks is 800, the progress with respect to each resource threshold and the progress in units of resource are as follows. That is, as the progress with respect to each resource threshold, the progress with respect to the "upper limit" of "the number of FS blocks" is 50%, the progress with respect to the "target value" of "the number of FS blocks" is 0%, the progress with respect to the "upper limit" of "the number of IS blocks" is 100%, and the progress with respect to the "target value" of "the number of IS blocks" is 100%. As the progress in units of resource, the progress with respect to "the number of FS blocks" is 20% and the progress with respect to "the number of IS blocks" is 100%.

When weighting for the number of FS blocks is 0.9 and weighting for the number of IS blocks is 0.1 with respect to the whole NAND organizing, the progress of the whole NAND organizing is 28% (=20×0.9+100×0.1).

Figure 18:
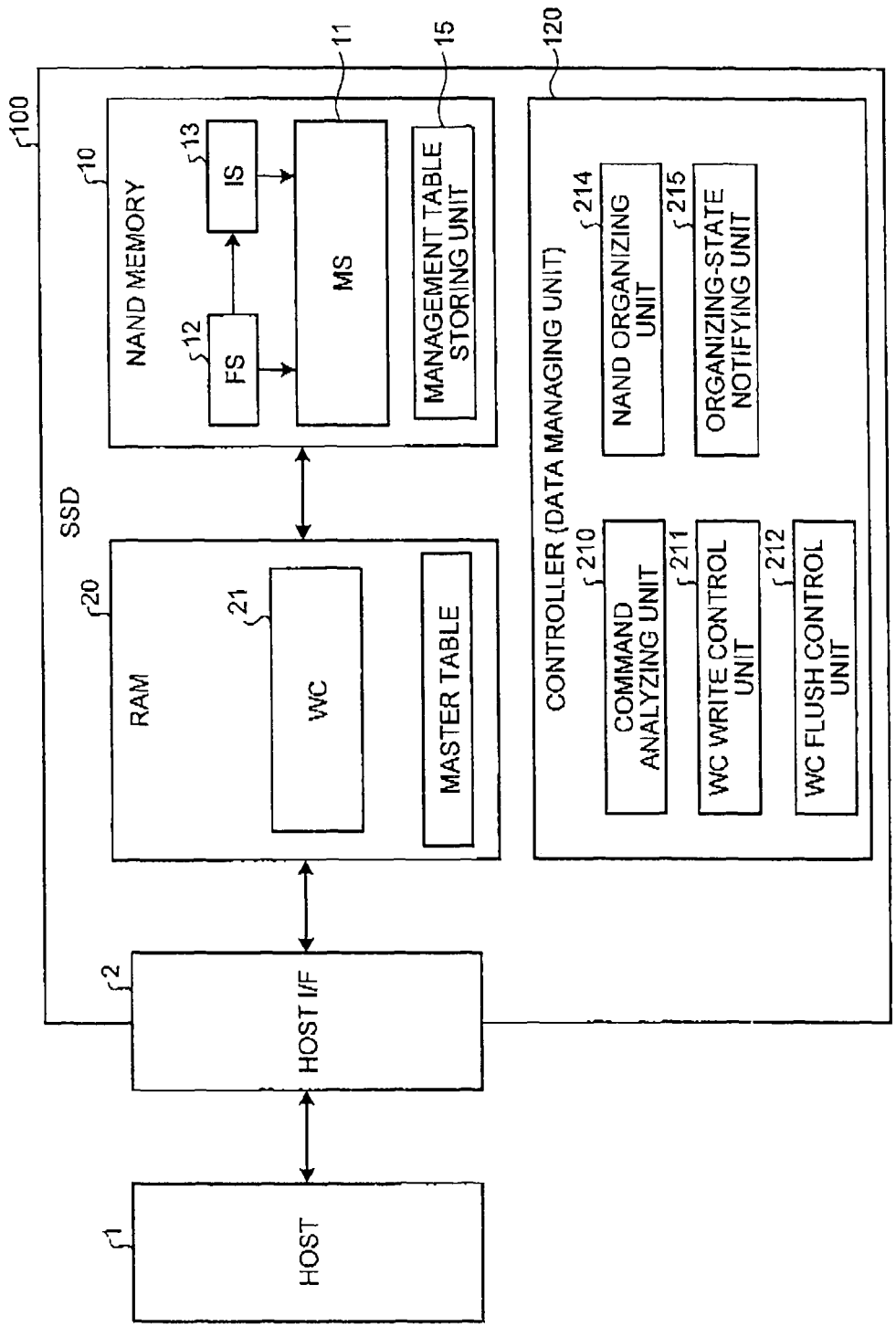
FIG. 18 is a functional block diagram illustrating a configuration of an essential part in the first embodiment.

FIG. 18 is a block diagram illustrating a functional configuration of an essential part in the present embodiment. As described above, the NAND memory 10 includes the MS 11, the FS 12, the IS 13, and a management table storing unit 15 that stores therein various management tables shown in FIG. 6. The RAM 20 includes the WC 21 and stores therein the above-described master table. The controller 120 as the data managing unit includes a command analyzing unit 210 that analyzes a command from the host 1, a WC write control unit 211 that controls writing of data from the host 1 to the WC 21, a WC flush control unit 212 that performs a flushing control of flushing data from the WC 21 to the NAND memory 10 and writing it in the NAND memory 10, a NAND organizing unit 214 that performs the organizing (compaction, defragmentation, data relocation from the FS 12 to the IS 13, and the like) in the NAND memory 10, and an organizing-state notifying unit 215 that determines the current organizing state in the NAND memory 10 and notifies the host 1 of the state. When the organizing-execution request command EXE_ORG is input from the host 1 or when there is no request from the host 1 for a certain period of time and the state transitions to an idle state, if the used amount of resource of the NAND memory 10 exceeds the upper limit or the target value shown in FIG. 15, the NAND organizing unit 214 performs the NAND organizing.

Figure 19:
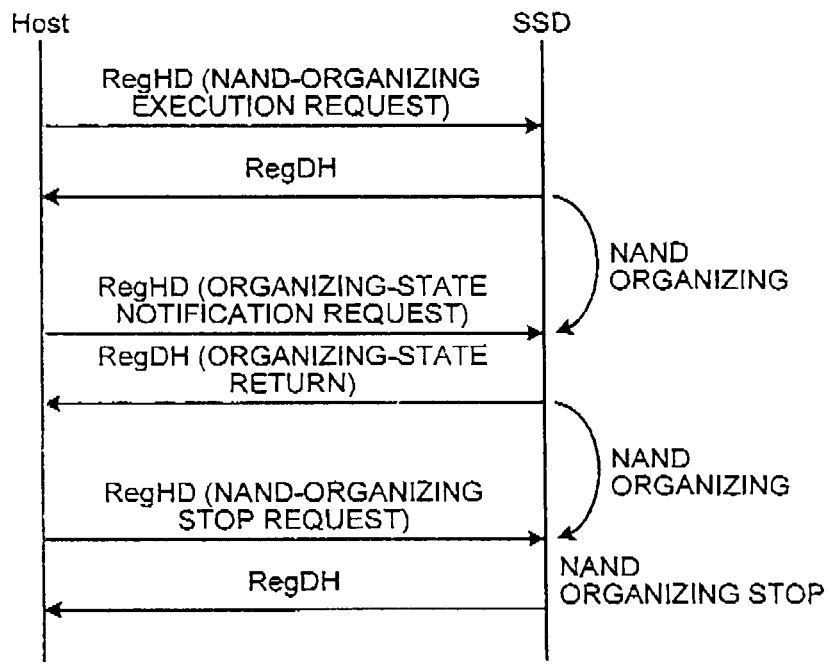
FIG. 19 is a diagram illustrating an example of a command sequence between a host and the SSD.

FIG. 19 illustrates an example of a command transmission and reception sequence in the NAND organizing between the host 1 and the SSD 100. In FIG. 19, first, the organizing-execution request command EXE_ORG is transmitted from the host 1 to the SSD 100, and the response to this organizing-execution request command EXE_ORG is returned from the SSD 100 to the host 1. The SSD 100 starts the NAND organizing with the reception of a NAND-organizing execution request ORG as a trigger. Thereafter, in FIG. 19, the organizing-state notification request command RQSTS_ORG is transmitted from the host 1 to the SSD 100 for checking the NAND organizing state in the SSD 100, and a response signal including data that indicates the NAND organizing state is returned from the SSD 100 to the host 1 in response thereto. In FIG. 19, after the host 1 checks the NAND organizing state, the organizing-stop request command ABT_ORG is transmitted from the host 1 to the SSD 100 to stop the NAND organizing. With this organizing-stop request command ABT_ORG, the NAND organizing is stopped in the SSD 100 and the SSD 100 returns a response signal thereto to the host 1.

Figure 20:
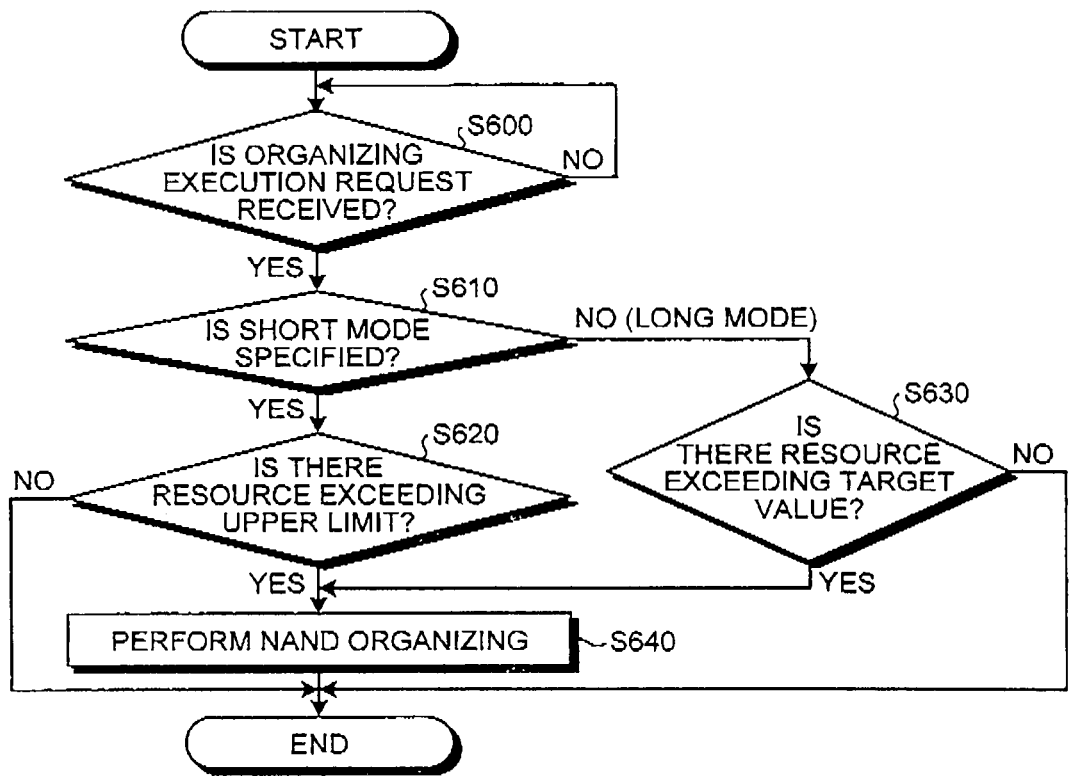
FIG. 20 is a flowchart illustrating an example of an operation procedure in the SSD when the SSD receives an organizing-execution request command.

FIG. 20 illustrates an operation procedure in the SSD 100 when the SSD 100 receives the organizing-execution request command EXE_ORG. When the command analyzing unit 210 of the controller 120 analyzes the feature field of the command transmitted from the host 1 and determines that the received command is the organizing-execution request command EXE_ORG (Step S600), the command analyzing unit 210 next analyzes the LBA field to determine which one of the short mode and the long mode is specified, and notifies the NAND organizing unit 214 of the determination result (Step S610). When the short mode is specified, the NAND organizing unit 214 determines whether there is a resource exceeding the upper limit among the resources of the NAND organizing target (Step S620). When there is a resource exceeding the upper limit, the NAND organizing (defragmentation, compaction, data relocation from the FS to the IS, and the like) corresponding to the resource is performed to make the used amount of resource be the upper limit or less (Step S640). Moreover, when the long mode is specified, the NAND organizing unit 214 determines whether there is a resource exceeding the target value among the resources of the NAND organizing target (Step S630). When there is a resource exceeding the target value, the NAND organizing (defragmentation, compaction, data relocation from the FS to the IS, and the like) corresponding to the resource is performed to make the used amount of resource be the target value or less (Step S640).

Figure 21:
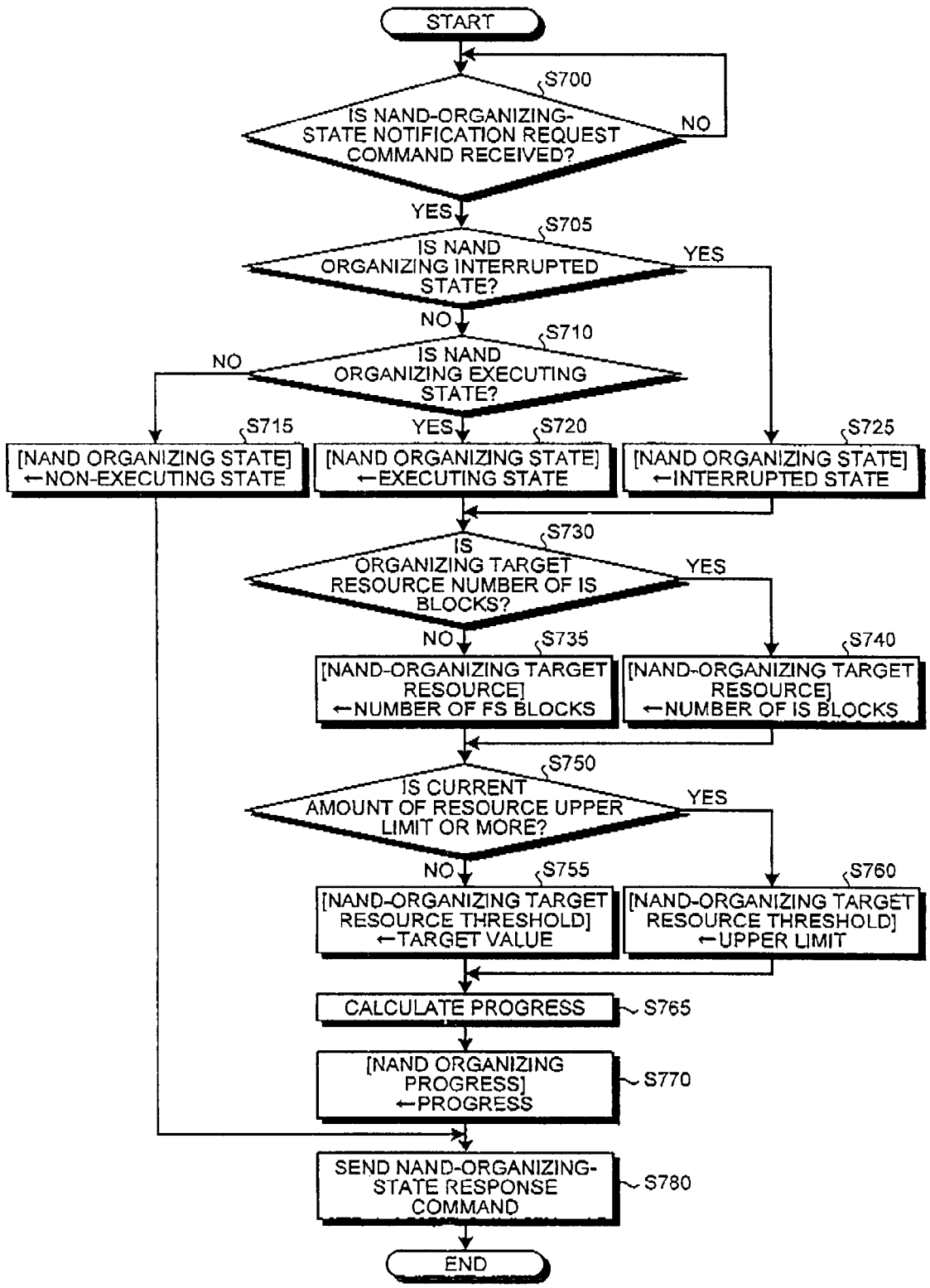
FIG. 21 is a flowchart illustrating an example of an operation procedure in the SSD when the SSD receives an organizing-state notification request command.

FIG. 21 illustrates an operation procedure in the SSD 100 when the SSD 100 receives the organizing-state notification request command RQSTS_ORG. When the command analyzing unit 210 analyzes the feature field of the command transmitted from the host 1 and determines that the received command is the organizing-state notification request command RQSTS_ORG (Step S700), the command analyzing unit 210 notifies the organizing-state notifying unit 215 of that effect. Upon receiving the notification, the organizing-state notifying unit 215 inquires of the NAND organizing unit 214 which one of the "interrupted state", the "executing state", and the "non-executing state" the current NAND organizing state is (Steps S705 and S710). When the organizing-state notifying unit 215 determines that the NAND organizing state is the "non-executing state", the organizing-state notifying unit 215 sets the field (feature field in the case of FIG. 17) of the NAND organizing state of the response command to be returned to the host 1 to the non-executing state "00h" (Step S715) and returns the response command to the host 1 (Step S780).

Moreover, when the organizing-state notifying unit 215 determines that the NAND organizing state is the "interrupted state", the organizing-state notifying unit 215 sets the field of the NAND organizing state of the response command to be returned to the host 1 to the interrupted state "01h" (Step S725), and when the organizing-state notifying unit 215 determines that the NAND organizing state is the "executing state", the organizing-state notifying unit 215 sets the field of the NAND organizing state of the response command to be returned to the host 1 to the executing state "02h" (Step S720). Next, the organizing-state notifying unit 215 determines the resource of the organizing target by inquiring of the NAND organizing unit 214 (Step S730). FIG. 21 illustrates the case where the resource of the organizing target includes the number of FS blocks and the number of IS blocks. When the resource of the organizing target is the number of FS blocks, the organizing-state notifying unit 215 sets the field (upper few bits of the count field in FIG. 17) of the NAND-organizing target resource to the number of FS blocks "0h" (Step S735), and when the resource of the organizing target is the number of IS blocks, the organizing-state notifying unit 215 sets the field of the NAND-organizing target resource to the number of IS blocks "1h" (Step S740).

Next, the organizing-state notifying unit 215 determines the current used amount of resource by inquiring of the NAND organizing unit 214 (Step S750). When the current used amount of resource is the upper limit or more, the organizing-state notifying unit 215 sets the field (lower few bits of the count field in FIG. 17) of the NAND-organizing target resource threshold to the upper limit "0h" (Step S760), and when the current used amount of resource is less than the upper limit and is more than the target value, the organizing-state notifying unit 215 sets the field of the NAND-organizing target resource threshold to the target value "1h" (Step S755). Next, the progress of the NAND organizing is calculated (1) for each resource threshold, (2) in units of resource, and/or (3) based on a total value by weighting (Step S765), and the calculated progress is set to the field (LBA field in FIG. 17) of the NAND organizing progress (Step S770). Then, the NAND organizing unit 214 returns the response command in which the value corresponding to the current NAND organizing state is set to each filed to the host 1 (Step S780).

Figure 22:
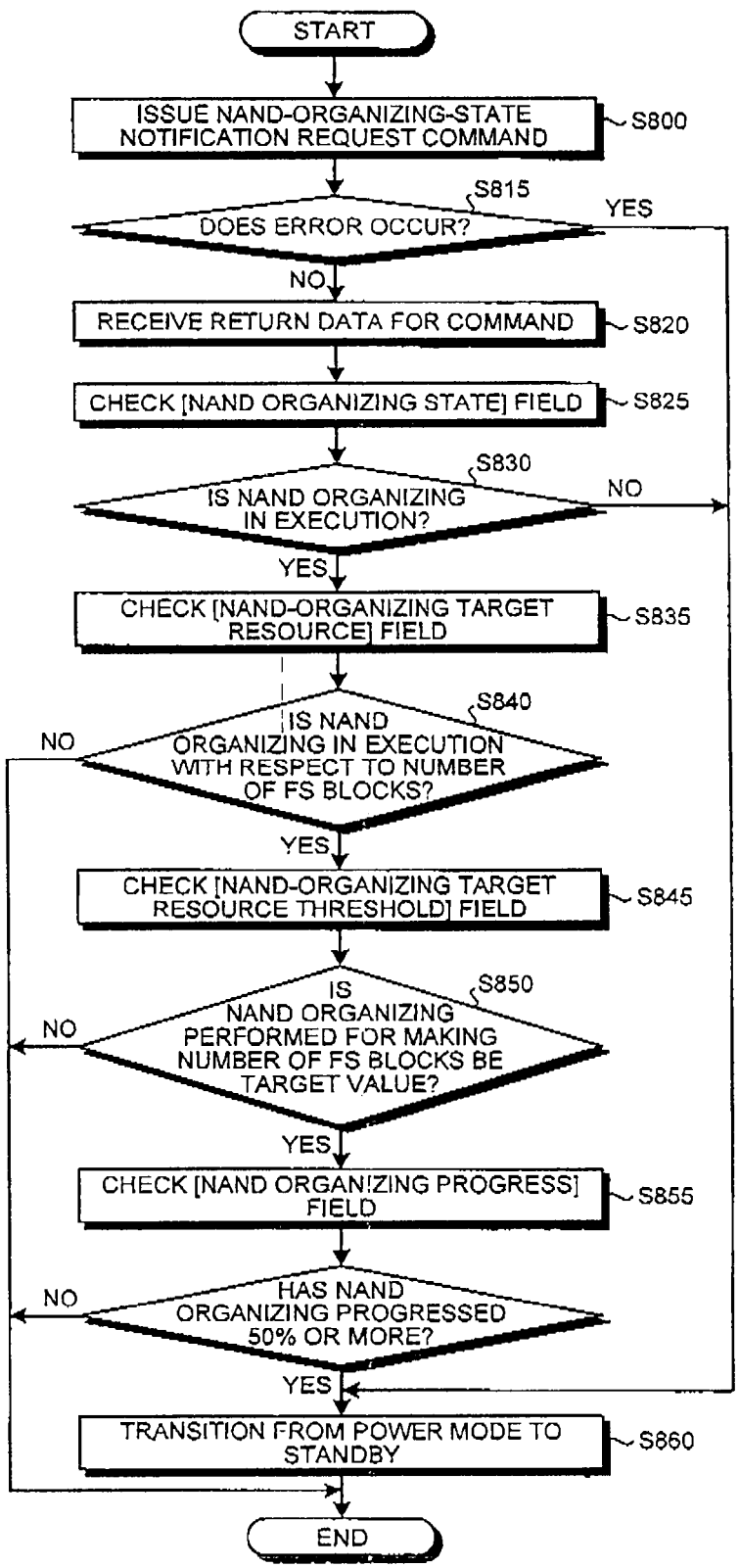
FIG. 22 is a flowchart illustrating an example of an operation procedure in the host when the host receives a response signal to the organizing-state notification request command.

FIG. 22 illustrates a control procedure in the case where the host 1 receives a response signal to the organizing-state notification request command RQSTS_ORG from the SSD 100. In this operational example, the mode is transitioned from a power mode to a standby mode according to the content of the response signal to the organizing-state notification request command RQSTS_ORG notified from the SSD 100. In this case, the transition condition to the standby mode is that the NAND organizing with respect to the number of FS blocks has progressed 50% or more with respect to the target value.

The host 1 issues the organizing-state notification request command RQSTS_ORG (Step S800), and thereafter, when an error, such as no response from the SSD 100, occurs (Yes at Step S815), the host 1 causes the mode to transition from the power mode to standby when the standby condition is satisfied regardless of the response from the SSD 100 (Step S860). On the other hand, when an error does not occur and the host 1 receives a response command from the SSD 100

(Step S820), the host 1 checks the NAND organizing state field in the response command. When the SSD 100 is not in execution of the NAND organizing (No at Step S830), the host 1 causes the mode to transition from the power mode to standby when the standby condition is satisfied (Step S860).

When the host 1 determines that the SSD 100 is in execution of the NAND organizing, the host 1 next checks the field of the NAND-organizing target resource in the response command (Step S835). When the SSD 100 is not in execution of the NAND organizing with respect to the number of FS blocks (No at Step S840), the process ends. When the SSD 100 is in execution of the NANO organizing with respect to the number of FS blocks (Yes at Step S840), the host 1 next checks the field of the NAND-organizing target resource threshold in the response command (Step S845). With this checking, when the host 1 determines that the SSD 100 is not performing the NAND organizing for making the number of FS blocks be the target value, (No at Step S850), the process ends. However, when the host 1 determines that the SSD 100 is performing the NAND organizing for making the number of FS blocks be the target value, (Yes at Step S850), the host 1 next checks the NAND organizing progress field (Step S855). If the host 1 can determine through checking of the NAND organizing progress field that the NAND organizing with respect to the number of FS blocks has progressed 50% or more with respect to the target value, the host 1 causes the mode to transition from the power mode to the standby when the standby condition is satisfied (Step S860). However, if the NAND organizing with respect to the number of FS blocks has not progressed 50% or more with respect to the target value, transition to the standby is not performed and the process ends.

In this manner, according to the first embodiment, because the organizing-state notification request command RQSTS_ORG is defined, the host can recognize the execution state of the NAND organizing, whereby the access control and the transition control to the power-saving mode such as standby and sleep can be performed in consideration of the execution state of the NAND organizing. A write request or a transition request from the power mode to standby or sleep is delayed considering also the state of the host while monitoring the progress of the NAND organizing by the host, so that a command response performance with respect to the subsequent write request can be finely adjusted. Moreover, even when the host needs frequent transition to standby or sleep in consideration of the power consumption, the mode can be transitioned to standby or sleep after checking that the NAND organizing is completed or in progress, so that power-saving control can be efficiently performed without postponing the NAND organizing. In the present embodiment, because the organizing-execution request command EXE_ORG is defined, the host can cause the SSD to perform the NAND organizing at arbitrary timing, so that response to the WRITE command and the like is expected to improve from the standpoint of the host and the writing efficiency to the NAND memory can be improved in the SSD. The organizing-execution request command EXE_ORG includes two modes, i.e., the short mode and the long mode, so that if the two modes are selectively used according to the state of the host, response to the WRITE command and the like can be expected to be further improved, and the writing efficiency to the NAND memory can be further improved in the SSD.

In the above embodiment, two buffers, i.e., the FS 12 and the IS 13 are provided at a pre-stage of the MS 11, it is applicable to provide one buffer VS, to which low-density data is input from the WC 21 to be managed in cluster units, at a pre-stage of the MS 11. When one buffer VS is provided at a pre-stage of the MS 11, the number of VS blocks, the occupied capacity of the management table for VS, and the like are employed as the NAND resource name of the organizing target, and the defragmentation processing of integrating clusters of the buffer VS into a track and flushing it to the MS 11, the compaction in the buffer VS, and the like are employed as examples of the action of the NAND organizing.

Moreover, in the above embodiment, the NAND memory 10 is configured to be able to perform a channel parallel operation by a plurality of channels; however, the NAND memory 10 can be connected to the drive control circuit 4 with a single channel. Moreover, the present invention can be applied to the NAND memory 10 that does not perform the bank interleave or to the NAND memory 10 that does not perform a plane parallel operation.

Furthermore, it is applicable that a response signal to the organizing-state notification request command RQSTS_ORG from the SSD 100 does not include the target resource name of the NAND organizing and the organizing target threshold and include only the state (executing state/non-executing state) of the NAND organizing and the progress.

(Second Embodiment)

Figure 23:
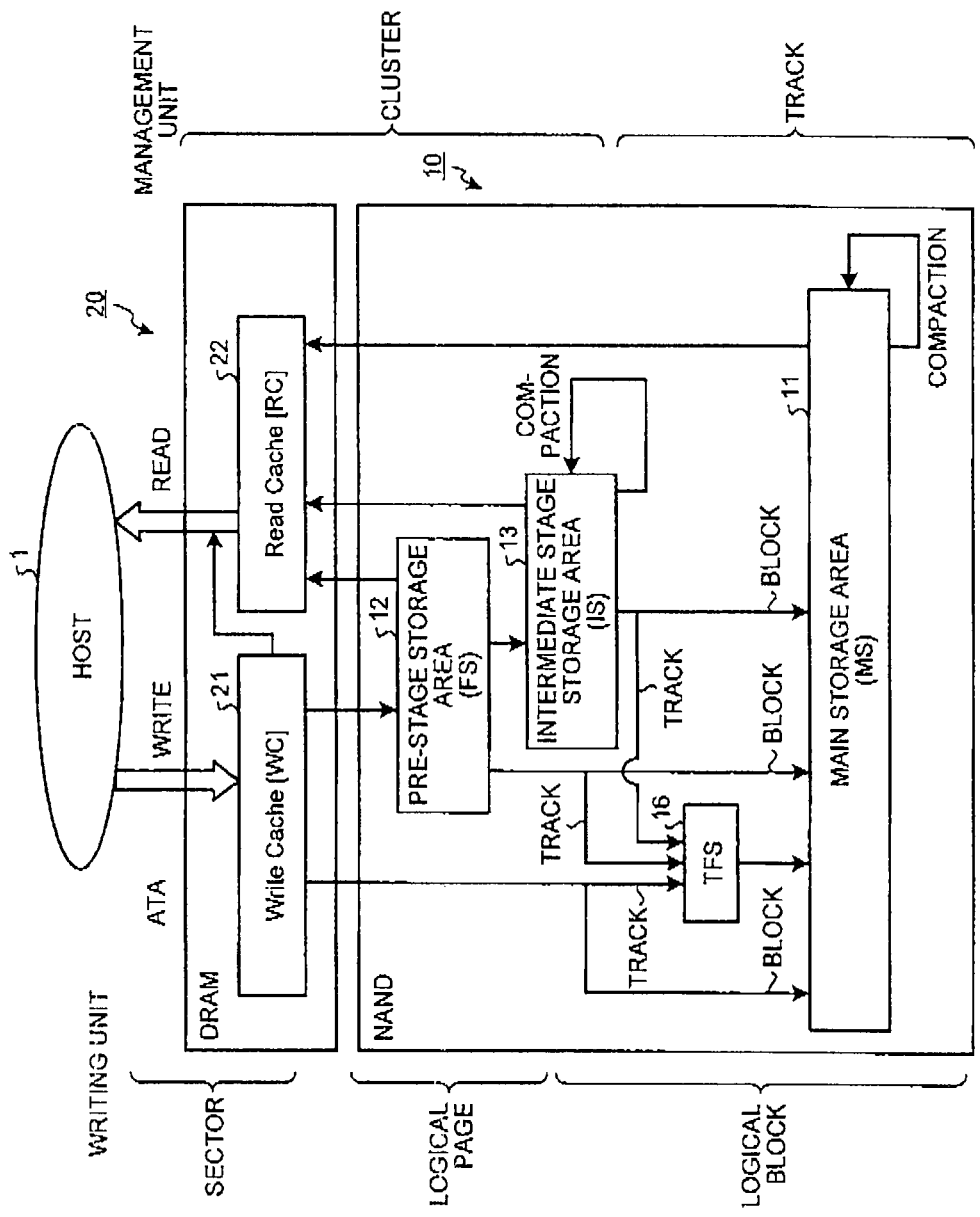
FIG. 23 is a block diagram illustrating a functional configuration formed in a NAND memory and a RAM in the second embodiment.

The second embodiment is explained with reference to FIG. 23. FIG. 23 illustrates functional blocks in the second embodiment formed in the NAND memory 10 and the RAM 20. In the first embodiment, the track size and the logical block size are the same; however, they can be different. In the second embodiment, the logical block size is larger than the track size. If the logical block size that is a data erasing unit and the track size that is a data management unit are different, according to the progress of rewriting of a NAND memory, blocks are made porous by invalid (non-latest) data in the MS 11. When the blocks in such a porous state increase, substantially usable blocks decrease and a storage area of the NAND memory 10 cannot be effectively used. Therefore, in the second embodiment, in the MS 11 also, if the number of logical blocks assigned to the MS 11 exceeds the upper limit of the number of blocks allowable as the MS 11, the compaction is performed to generate invalid free blocks. In the compaction in the MS 11, valid tracks are collected from logical blocks having small number of valid tracks and the collected valid tracks are written in the new logical block (free block).

As described above, in the buffer structure shown in FIG. 4 and FIG. 23, the FS 12 is provided to reduce the possibility that data with a high update frequency slips into the compaction processing in the IS 13 of the subsequent stage. In the second embodiment, the compaction is performed in the MS 11, so that a buffer (track pre-stage storage area: TFS) 16 that has a function similar to the FS 12 is provided at pre-stage of the MS 11 to reduce the possibility that data with a high update frequency slips into the compaction processing in the MS 11.

The TFS 16 manages data in track units and adapts the FIFO structure in which logical blocks are arranged in the order of inputting data. In the TFS 16, data from the WC 21, the FS 12, and the IS 13 is written in track units. The logical block that becomes full by a plurality of tracks written therein is moved to the subsequent stage.

When the number of blocks of the TFS 16 exceeds a predetermined upper limit allowed as the TFS 16, the oldest block is flushed from the TFS 16 to the MS 11. A logical block formed by the compaction processing in the MS 11 can be input to the TFS 16.

Moreover, when the TFS 16 is provided, data is input to the MS 11 through two routes, i.e., a route via the TFS 16 and a route directly input to the MS 11 without via the TFS 16.

When flushing a high-density track from the WC 21 to the MS 11, high-density tracks are collected for a logical block, and the high-density tracks for the logical block are directly flushed to the MS 11 and high-density tracks, the number of which is less than that for the logical block, are flushed to the TFS 16. When data is flushed from the FS 12 or the IS 13 to the MS 11 by the defragmentation processing or the like, clusters to be flushed are collected in track units and tracks in which the number of valid clusters is a predetermined threshold or more are collected for a logical block, and the tracks collected for the logical block are directly flushed to the MS 11 and tracks, the number of which is less than that for one logical block, are flushed to the TFS 16.

In this manner, in the second embodiment, the compaction is performed in the MS 11 and the TFS 16 is provided at a pre-stage of the MS 11. Therefore, in the second embodiment, the number of TFS blocks and the number of MS blocks are added to the target resource of the NAND organizing. The number of TFS blocks is the number of logical blocks belonging to the TFS, and the number of MS blocks is the number of current logical blocks (the number of blocks that fall under MS management from the FB) belonging to the MS 11 and also indicates the ratio of valid data to the maximum number of MS blocks. The upper limit and the target value are set to the number of TFS blocks and the number of MS blocks, and when the number of TFS blocks or the number of MS blocks exceeds the upper limit or the target value, the NAND organizing such as MS compaction is performed.

Therefore, when the organizing-execution request command EkE $_{13}$ORG is received from the host 1, the number of TFS blocks and the number of MS blocks are also included in the resource of the NAND organizing target, and when these resources exceed the upper limit or the target value, the NAND organizing such as the MS compaction is performed.

Moreover, when the organizing-state notification request command RQSTS_ORG is received from the host 1, the number of TFS blocks and the number of MS blocks are included in the resource of the NAND organizing target the NAND organizing state is notified to the host 1.

When the logical block size is larger than the track size also, it is applicable to provide one buffer VS described above at a pre-stage of the MS 11 without providing two buffers, i.e., the FS 12 and the IS 13 at a pre-stage of the MS 11. As the NAND resource name of the organizing target in this case, the number of VS blocks, the occupied capacity of the management table for VS, the number of TFS blocks, the number of MS blocks, and the like are employed, and the defragmentation processing of integrating clusters of the buffer VS into a track and flushing it to the MS 11, the compaction in the buffer VS,H the compaction in the MS 11, and the like are employed as examples of the action of the NAND organizing.

(Third Embodiment)

Figure 24:
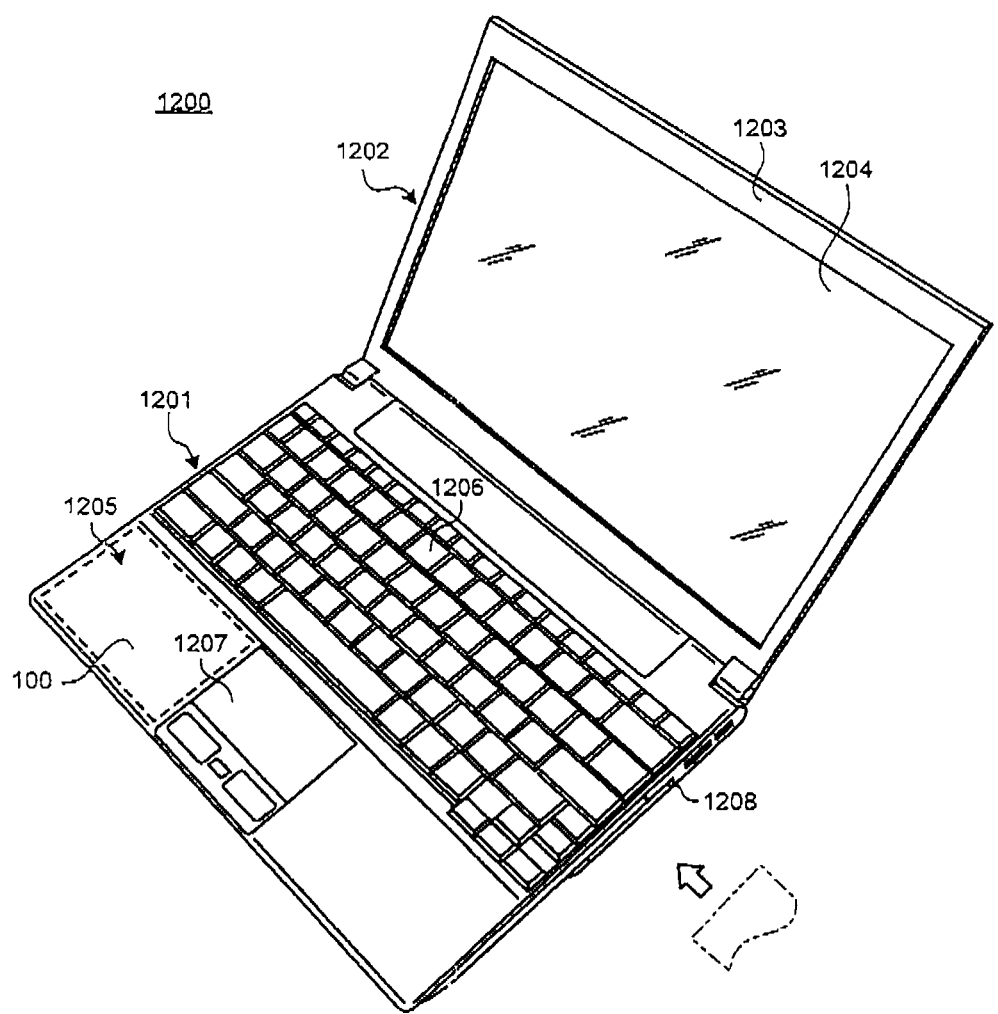
FIG. 24 is an overall view of a personal computer on which the SSD is mounted.

FIG. 24 is a perspective view illustrating an example of a personal computer (PC) 1200 as an information processing apparatus on which the SSD 100 is mounted. The PC 1200 includes a main body 1201 and a display unit 1202. The display unit 1202 includes a display housing 1203 and a display device 1204 accommodated in the display housing 1203.

The main body 1201 includes a chassis 1205, a keyboard 1206, and a touch pad 1207 as a pointing device. The chassis 1205 includes therein a main circuit board, an optical disk device (ODD) unit, a card slot, the SSD 100, and the like.

The card slot is provided so as to be adjacent to the peripheral wall of the chassis 1205. The peripheral wall has an opening 1208 facing the card slot. A user can insert and remove an additional device into and from the card slot from outside the chassis 1205 through the opening 1208.

The SSD 100 can be used instead of a conventional hard disk drive (HDD) in the state of being mounted on the PC 1200 or can be used as an additional device in the state of being inserted into the card slot included in the PC 1200.

Figure 25:
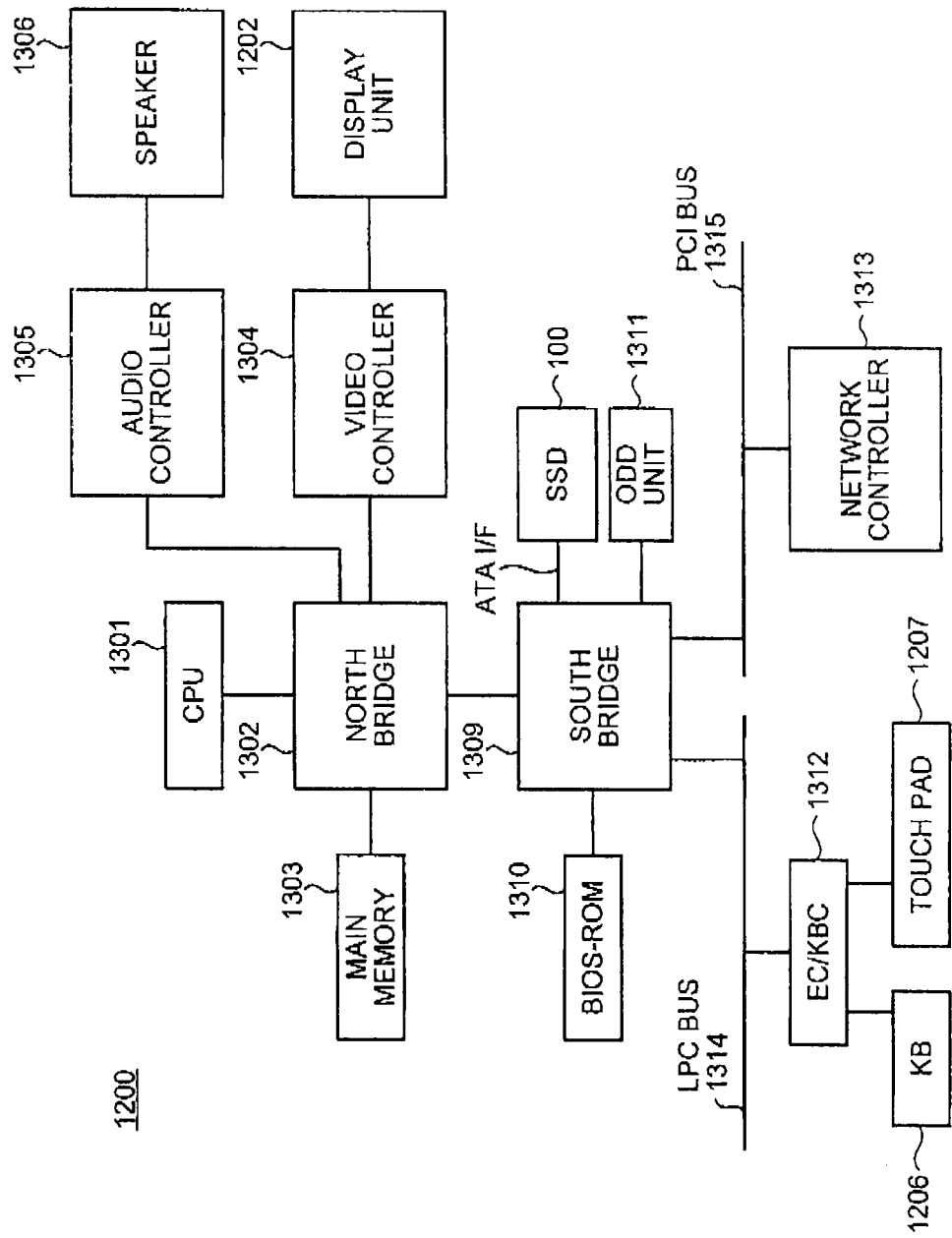
FIG. 25 is a diagram of a system configuration example of the personal computer on which the SSD is mounted.

FIG. 25 illustrates a system configuration example of the PC 1200 on which the SSD 100 is mounted. The PC 1200 includes a CPU 1301, a north bridge 1302, a main memory 1303, a video controller 1304, an audio controller 1305, a south bridge 1309, a basic input/output system read-only memory (BIOS-ROM) 1310, the SSD 100, an ODD unit 1311, an embedded controller/keyboard controller IC (EC/KBC) 1312, a network controller 1313, and the like.

The CPU 1301 is a processor for controlling an operation of the PC 1200, and executes an operating system (OS) loaded from the SSD 100 onto the main memory 1303. Furthermore, when the ODD unit 1311 is capable of executing at least one of read processing and write processing on a mounted optical disk, the CPU 1301 executes the processing.

Moreover, the CPU 1301 executes a system BIOS stored in the BIOS-ROM 1310. The system BIOS is a computer program for controlling a hardware of the PC 1200.

The north bridge 1302 is a bridge device that connects a local bus of the CPU 1301 to the south bridge 1309. The north bridge 1302 has a memory controller for controlling an access to the main memory 1303.

Moreover, the north bridge 1302 has a function of executing a communication with the video controller 1304 and a communication with the audio controller 1305 through an accelerated graphics port (AGP) bus and the like.

The main memory 1303 temporarily stores therein a computer program and data, and functions as a work area of the CPU 1301. The main memory 1303, for example, consists of a RAM.

The video controller 1304 is a video reproduction controller for controlling the display unit 1202 used as a display monitor of the PC 1200.

The audio controller 1305 is an audio reproduction controller for controlling a speaker 1306 of the PC 1200.

The south bridge 1309 controls each device on a low pin count (LPC) bus 1314 and each device on a peripheral component interconnect (PCI) bus 1315. Moreover, the south bridge 1309 controls the SSD 100 that is a memory device storing various types of software and data through the ATA interface.

The PC 1200 accesses the SSD 100 in sector units. A write command, a read command, a flush command, and the like are input to the SSD 100 through the ATA interface.

The south bridge 1309 has a function of controlling an access to the BIOS-ROM 1310 and the ODD unit 1311.

The EC/KBC 1312 is a one-chip microcomputer in which an embedded controller for power management and a keyboard controller for controlling the keyboard (KB) 1206 and the touch pad 1207 are integrated.

The EC/KBC 1312 has a function of turning on/off the PC 1200 based on an operation of a power button by a user. The network controller 1313 is, for example, a communication device that executes communication with an external network such as the Internet.

As the information processing apparatus on which the SSD 100 is mounted, an imaging device such as a still camera and a video camera can be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first storing unit as a cache memory;
   a second storing unit and a third storing unit included in a nonvolatile semiconductor memory in which data reading and writing is performed by a page unit and data erasing is performed by a block unit larger than the page unit; and
   a controller that allocates storage areas of the nonvolatile semiconductor memory to the second storing unit and the third storing unit by a logical block unit associated with one or more blocks, wherein
   the controller includes
      a write control unit that writes a plurality of data in a sector unit into the first storing unit,
      a flush control unit that flushes a plurality of data written in the first storing unit to the second storing unit as data in a first management unit having a size N times a size of the sector unit, wherein N is a natural number 2 or greater, and flushes a plurality of data written in the first storing unit to the third storing unit as data in a second management unit having a size M times a size of the first management unit, wherein M is a natural number 2 or greater,
      an organizing unit that, when a resource usage of the nonvolatile semiconductor memory exceeds a predetermined threshold, increases a resource by organizing data in the nonvolatile semiconductor memory, and
      an organizing-state notifying unit that, when an organizing-state notification request is input from a host, analyzes an organizing state by the organizing unit and outputs an analysis result to the host as an organizing-state notification.

2. The semiconductor storage device according to claim 1, wherein the organizing unit performs the organizing in a case where the resource usage of the nonvolatile semiconductor memory exceeds the threshold when an organizing execution request is input from the host.

3. The semiconductor storage device according to claim 2, wherein the organizing unit stops the organizing when an organizing stop request is input from the host.

4. The semiconductor storage device according to claim 1, wherein
   the threshold includes a first threshold and a second threshold smaller than the first threshold,
   the organizing is performed until the resource usage becomes the first threshold or less when the resource usage of the nonvolatile semiconductor memory exceeds the first threshold, and
   the organizing is performed until the resource usage becomes the second threshold or less when the resource usage of the nonvolatile semiconductor memory exceeds the second threshold at a time when the nonvolatile semiconductor memory is in an idle state.

5. The semiconductor storage device according to claim 2, wherein
   the threshold includes a first threshold and a second threshold smaller than the first threshold,
   the organizing unit performs the organizing until the resource usage becomes the first threshold or less in a case where the resource usage of the nonvolatile semiconductor memory exceeds the first threshold when the organizing execution request in a first mode is input from the host, and
   the organizing unit performs the organizing until the resource usage becomes the second threshold or less in a case where the resource usage of the nonvolatile semiconductor memory exceeds the second threshold when the organizing execution request in a second mode is input from the host.

6. The semiconductor storage device according to claim 1, wherein the resource usage of the nonvolatile semiconductor memory includes at least one of a resource usage of a number of logical blocks belonging to the second storing unit, a resource usage of a number of logical blocks belonging to the third storing unit, and a resource usage of a management table that manages data in the first management unit stored in the second storing unit.

7. The semiconductor storage device according to claim 6, wherein the organizing unit performs the organizing by flushing a plurality of data stored in the second storing unit to the third storing unit as data in the second management unit when the number of logical blocks belonging to the second storing unit exceeds the threshold.

8. The semiconductor storage device according to claim 6, wherein the organizing unit performs the organizing by selecting a plurality of valid data in the first management unit stored in the second storing unit and rewriting the valid data into a new logical block when the number of logical blocks belonging to the second storing unit exceeds the threshold.

9. The semiconductor storage device according to claim 6, wherein the organizing unit performs the organizing by selecting a plurality of valid data in the second management unit stored in the third storing unit and rewriting the valid data into a new logical block when the number of logical blocks belonging to the third storing unit exceeds the threshold.

10. The semiconductor storage device according to claim 6, wherein the organizing unit performs the organizing by flushing a plurality of data stored in the second storing unit to the third storing unit as data in the second management unit when the resource usage of the nonvolatile semiconductor memory of the management table exceeds the threshold.

11. The semiconductor storage device according to claim 6, wherein the organizing unit performs the organizing by selecting a plurality of valid data in the first management unit stored in the second storing unit and rewriting the valid data into a new logical block when the resource usage of the nonvolatile semiconductor memory of the management table exceeds the threshold.

12. The semiconductor storage device according to claim 2, wherein
   the second storing unit includes a fourth storing unit to which a plurality of data flushed from the first storing unit is written and a fifth storing unit to which a plurality of data stored in the fourth storing unit is relocated in a logical block unit, and
   the organizing unit performs the organizing by relocating a plurality of data stored in the fourth storing unit to the fifth storing unit in the logical block unit when number of logical blocks belonging to the fourth storing unit exceeds the threshold.

13. The semiconductor storage device according to claim 12, wherein
   the threshold includes a first threshold and a second threshold smaller than the first threshold,
   the organizing unit performs the organizing until the resource usage becomes the first threshold or less in a case where the resource usage of the nonvolatile semiconductor memory exceeds the first threshold when the organizing execution request in a first mode is input from the host, and
   the organizing unit performs the organizing until the resource usage becomes the second threshold or less in a case where the resource usage of the nonvolatile semiconductor memory exceeds the second threshold when the organizing execution request in a second mode is input from the host.

14. The semiconductor storage device according to claim 1, wherein the organizing-state notifying unit outputs the organizing-state notification, which includes an execution state of the organizing and a progress of the organizing, to the host.

15. The semiconductor storage device according to claim 14, wherein the organizing-state notification further includes an organizing-target resource name.

16. The semiconductor storage device according to claim 4, wherein the organizing-state notifying unit outputs the organizing-state notification, which includes an execution state of the organizing, a progress of the organizing, an organizing-target resource name, and information indicating whether the organizing is performed for the first threshold or the second threshold, to the host.

17. A method of controlling a semiconductor storage device that includes a first storing unit as a cache memory, and a second storing unit and a third storing unit included in a nonvolatile semiconductor memory in which data reading and data writing is performed by a page unit and data erasing is performed by a block unit larger than the page unit, the method comprising:
    allocating a storage area of the nonvolatile semiconductor memory to the second storing unit and the third storing unit by a logical block unit associated with one or more blocks;
    writing a plurality of data in a sector unit into the first storing unit;
    flushing a plurality of data written in the first storing unit to the second storing unit as data in a first management unit having a size N times as a size of the sector unit, wherein N is a natural number 2 or greater, and flushing a plurality of data written in the first storing unit to the third storing unit as data in a second management unit having a size M times as a size of the first management unit, wherein M is a natural number 2 or greater;
    increasing, when a resource usage of the nonvolatile semiconductor memory exceeds a predetermined threshold, a resource by organizing data in the nonvolatile semiconductor memory; and
    analyzing an organizing state and outputting an analysis result to a host as an organizing-state notification when an organizing-state notification request is input from the host.

18. An information processing apparatus comprising:
a host; and
a semiconductor storage device that includes
    a first storing unit as a cache memory,
    a second storing unit and a third storing unit included in a nonvolatile semiconductor memory in which data reading and writing is performed by a page unit and data erasing is performed by a block unit larger than the page unit; and
    a controller that allocates storage areas of the nonvolatile semiconductor memory to the second storing unit and the third storing unit by a logical block unit associated with one or more blocks, wherein the host includes a unit that issues an organizing-state notification request, and the controller of the semiconductor storage device includes
    a write control unit that writes a plurality of data in a sector unit into the first storing unit,
    a flush control unit that flushes a plurality of data written in the first storing unit to the second storing unit as data in a first management unit having a size N times as a size of the sector unit, wherein N is a natural number 2 or greater, and flushes a plurality of data written in the first storing unit to the third storing unit as data in a second management unit having a size M times as a size of the first management unit, wherein M is a natural number 2 or greater,
    an organizing unit that, when a resource usage of the nonvolatile semiconductor memory exceeds a predetermined threshold, increases a resource by organizing data in the nonvolatile semiconductor memory, and
    an organizing-state notifying unit that, when an organizing-state notification request is input from the host, analyzes an organizing state by the organizing unit and outputs an analysis result to the host as an organizing-state notification.

19. The information processing apparatus according to claim 18, wherein
the host further includes a unit that issues an organizing execution request, and
the organizing unit of the semiconductor storage device performs the organizing in a case where the resource usage of the nonvolatile semiconductor memories exceeds the threshold when the organizing execution request is input from the host.

20. The information processing apparatus according to claim 19, wherein
the host further includes a unit that issues an organizing stop request, and
the organizing unit of the semiconductor storage device stops the organizing when the organizing stop request is input from the host.

21. The information processing apparatus according to claim 18, wherein
the host analyzes the organizing state notification from the organizing-state notifying unit and determines to transition to a standby mode based on an analysis result thereof.

* * * * *

UNITED STATES PATENT AND TRADEMARK OFFICE
CERTIFICATE OF CORRECTION

PATENT NO. : 8,527,727 B2
APPLICATION NO. : 13/052146
DATED : September 3, 2013
INVENTOR(S) : Naoki Ootsuka et al.

Page 1 of 1

It is certified that error appears in the above-identified patent and that said Letters Patent is hereby corrected as shown below:

On the title page, Item (73), the Assignee information is incorrect. Item (73) should read:

--(73) Assignee: Kabushiki Kaisha Toshiba, Tokyo (JP)--

Signed and Sealed this
Twenty-ninth Day of October, 2013

Teresa Stanek Rea
*Deputy Director of the United States Patent and Trademark Office*